US 9,627,585 B2

(12) United States Patent
Okumoto

(10) Patent No.: US 9,627,585 B2
(45) Date of Patent: Apr. 18, 2017

(54) WIRING STRUCTURE, THIN FILM TRANSISTOR ARRAY SUBSTRATE INCLUDING THE SAME, AND DISPLAY DEVICE

(71) Applicant: Kazunori Okumoto, Tokyo (JP)

(72) Inventor: Kazunori Okumoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 625 days.

(21) Appl. No.: 13/781,404

(22) Filed: Feb. 28, 2013

(65) Prior Publication Data

US 2013/0234331 A1    Sep. 12, 2013

(30) Foreign Application Priority Data

Mar. 12, 2012    (JP) .................................. 2012-054387

(51) Int. Cl.
*H01L 23/48*    (2006.01)
*H01L 23/52*    (2006.01)
(Continued)

(52) U.S. Cl.
CPC ............ *H01L 33/42* (2013.01); *H01L 27/124* (2013.01)

(58) Field of Classification Search
CPC ............................... H01L 33/42; H01L 33/38
(Continued)

(56) References Cited

U.S. PATENT DOCUMENTS 6,417,575 B2 *   7/2002   Harada et al. ................ 257/784
6,646,707 B2    11/2003   Noh et al.
(Continued)

FOREIGN PATENT DOCUMENTS

CN         1327266 A     12/2001
CN       101087004 A     12/2007
(Continued)

OTHER PUBLICATIONS

An Office Action; "Notification of Reason(s) for Refusal," issued by the Japanese Patent Office on Oct. 27, 2015, which corresponds to Japanese Patent Application No. 2012-054387 and is related to U.S. Appl. No. 13/781,404; with English language partial translation.
(Continued)

*Primary Examiner* — Meiya Li
*Assistant Examiner* — Peter M Albrecht
(74) *Attorney, Agent, or Firm* — Studebaker & Brackett PC

(57) ABSTRACT

In a wiring conversion part which connects a lower conductive film to a first conductive film each functioning as a wiring, a first transparent conductive film is formed into a pattern in which it covers an end surface of the first conductive film, and an angle formed at a corner part in a portion of the first transparent conductive film making contact with a lower first insulating film (outside a width of the first conductive film) is larger than 90 degrees and smaller than 270 degrees or the corner part has an arc shape. A second transparent conductive film is connected to the lower conductive film and the first transparent conductive film, and the first transparent conductive film is connected to the first conductive film, so that the lower conductive film and the first conductive film are electrically connected to each other.

15 Claims, 21 Drawing Sheets

(51) Int. Cl.
*H01L 29/40* (2006.01)
*H01L 33/42* (2010.01)
*H01L 27/12* (2006.01)

(58) Field of Classification Search
USPC .............. 257/91, 734, 741, 744, 773, 774
See application file for complete search history.

(56) References Cited

U.S. PATENT DOCUMENTS

| | | | |
|---|---|---|---|
| 6,936,861 B2 * | 8/2005 | Hata et al. ...................... | 257/99 |
| 2002/0005583 A1 | 1/2002 | Harada et al. | |
| 2005/0285195 A1 | 12/2005 | Choi et al. | |
| 2006/0139504 A1 | 6/2006 | Ahn et al. | |
| 2007/0295963 A1 | 12/2007 | Yano et al. | |
| 2008/0131668 A1 * | 6/2008 | Masutani et al. .......... | 428/195.1 |
| 2010/0001278 A1 | 1/2010 | Choi et al. | |
| 2010/0187532 A1 * | 7/2010 | Nagano et al. ................. | 257/59 |
| 2010/0231820 A1 | 9/2010 | Ahn et al. | |
| 2012/0113376 A1 * | 5/2012 | Hayashi et al. .............. | 349/141 |

FOREIGN PATENT DOCUMENTS

| | | |
|---|---|---|
| CN | 101093848 A | 12/2007 |
| CN | 101202286 A | 6/2008 |
| CN | 101788738 A | 7/2010 |
| JP | 2002-214634 A | 7/2002 |
| JP | 2006-013513 A | 1/2006 |
| JP | 2006-178113 A | 7/2006 |
| JP | 2006-184861 A | 7/2006 |
| JP | 3826217 B | 7/2006 |
| JP | 2007-329298 A | 12/2007 |
| JP | 2010-191410 A | 9/2010 |
| JP | 2011-017822 A | 1/2011 |

OTHER PUBLICATIONS

The Second Office Action issued by the Chinese Patent Office on Nov. 23, 2015, which corresponds to Chinese Patent Application No. 201310078003.2 and is related to U.S. Appl. No. 13/781,404; with English language partial translation.

The First Office Action issued by the Chinese Patent Office on Mar. 18, 2015, which corresponds to Chinese Patent Application No. 201310078003.2 and is related to U.S. Appl. No. 13/781,404; with English language partial translation.

Committee for Chinese Terms in Material Science and Technology; "Chinese Terms in Materials Science and Technology 2010"; 2011; pp. 160-163; Science Press; Beijing, China. ISBN : 978-7-03-027265-2.

* cited by examiner

F I G. 6
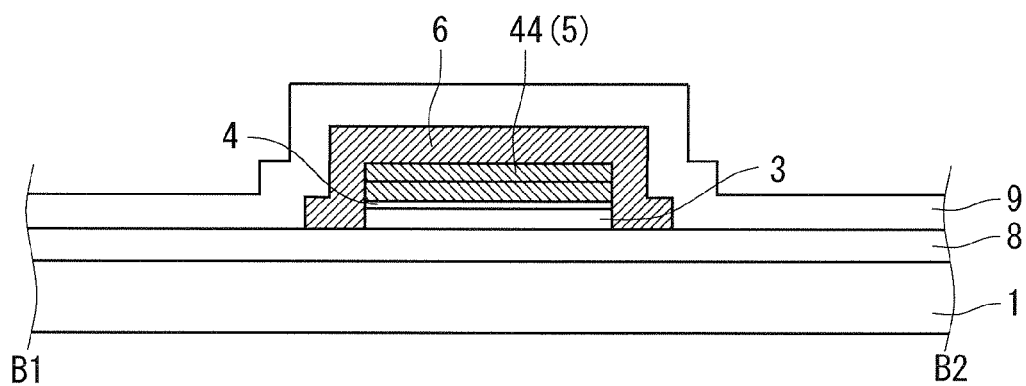

F I G . 1 5
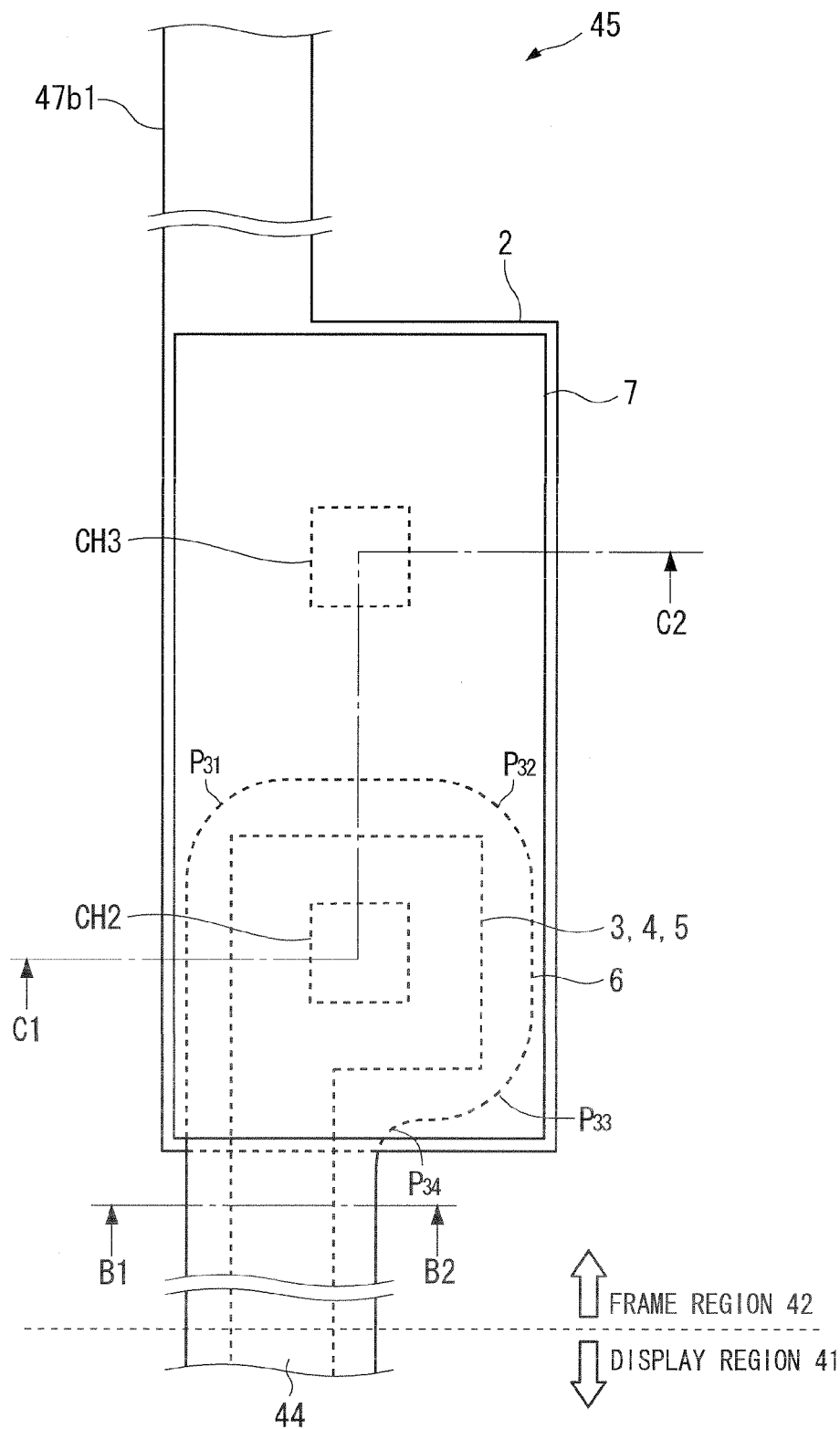

F I G. 1 8
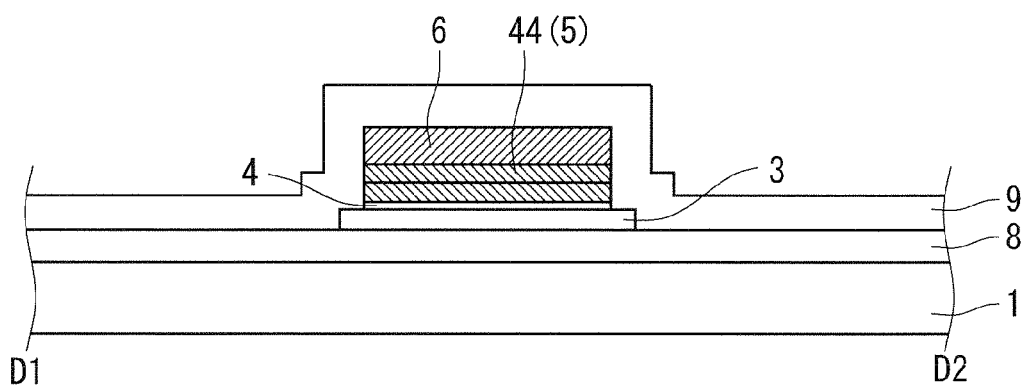

F I G . 1 9
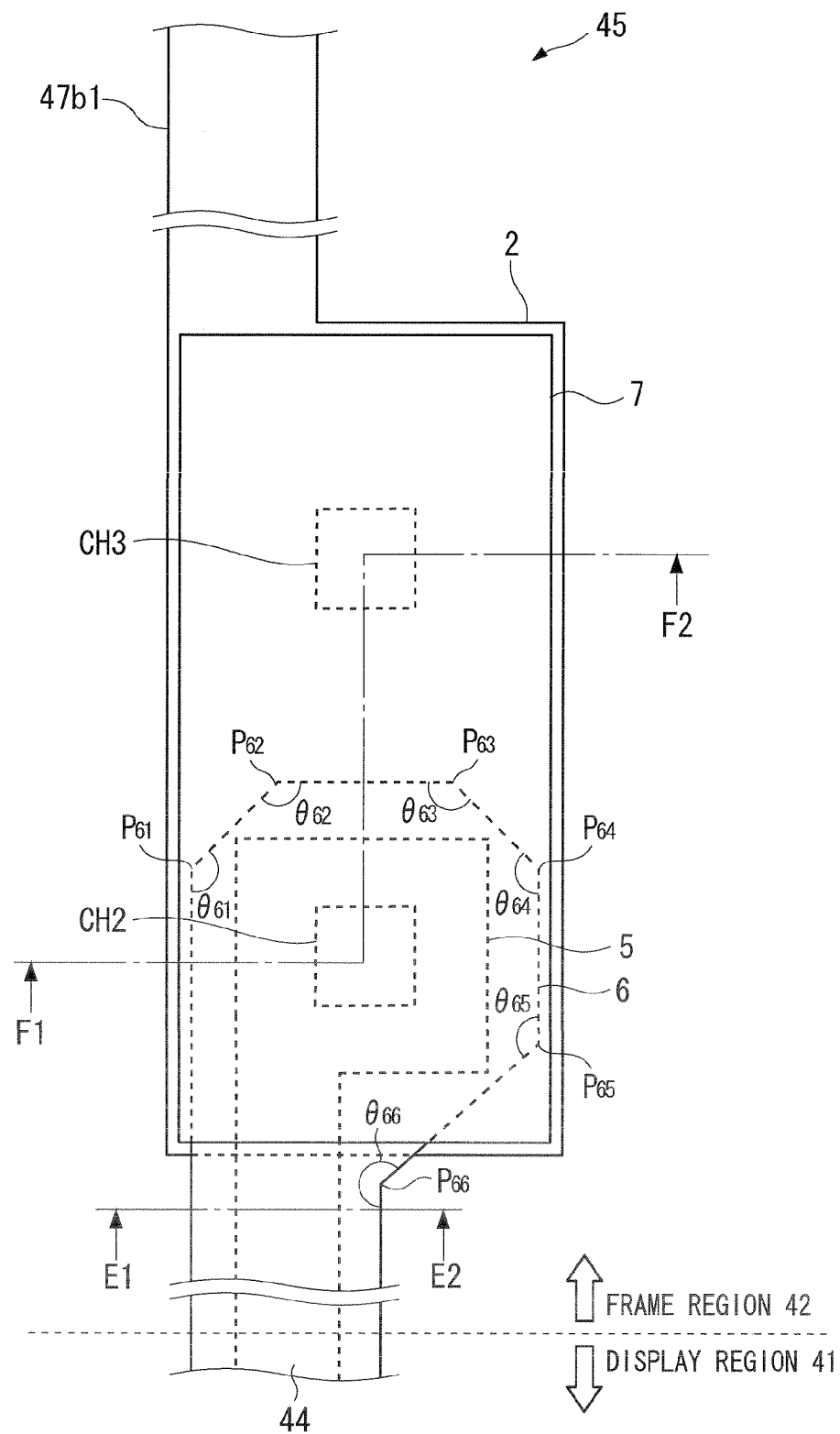

F I G . 2 0
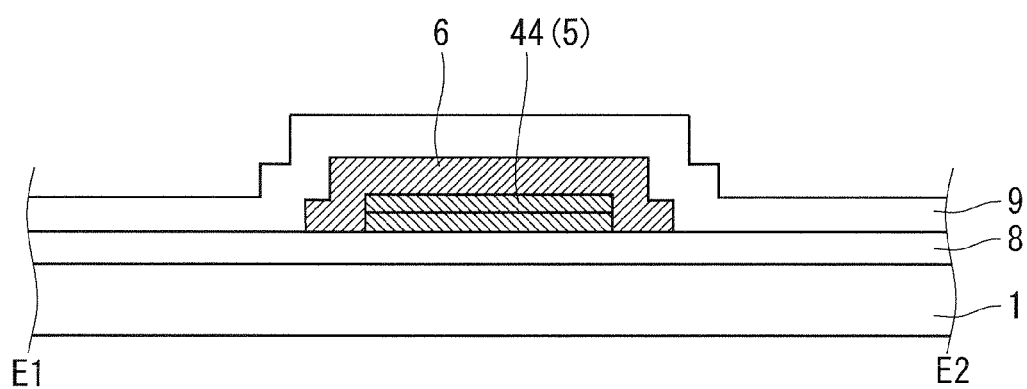

WIRING STRUCTURE, THIN FILM TRANSISTOR ARRAY SUBSTRATE INCLUDING THE SAME, AND DISPLAY DEVICE

BACKGROUND OF THE INVENTION

Field of the Invention

The present invention relates to a wiring structure including a wiring of a transparent conductive film, which is disposed, for example, on a display panel of a liquid crystal display device or the like.

Description of the Background Art

Recently, a fringe field switching (FFS) mode has been increasingly employed in a liquid crystal display device, as a liquid crystal mode capable of achieving both characteristics of a wide viewing angle and high transmittance. An FFS mode TFT array substrate includes a structure in which two transparent conductive films overlap with each other with an insulating film interposed therebetween, as shown in Japanese Patent No. 3826217, for example. On the other hand, a general twisted nematic (TN) mode TFT array substrate has one transparent conductive film. Accordingly, the number of photoengraving steps required for manufacturing the FFS mode TFT array substrate is increased by at least one step compared to that of the general TN mode TFT array substrate.

As measures against such increase in the number of steps, Japanese Patent Application No. 2010-191410 discloses a technique of reducing the number of required photoengraving steps by devising the arrangement of a transparent conductive film pattern provided on the FFS mode TFT array substrate. The configuration of the FFS mode TFT array substrate disclosed in Japanese Patent Application No. 2010-191410 can be formed through the same number of photoengraving steps as that used in manufacturing the general TN mode TFT array substrate.

As described above, the FFS mode TFT array substrate includes the structure in which the two transparent conductive films overlap with each other with the insulating film interposed therebetween. In this case, a balance between stress generated in the lower transparent conductive film and stress generated in the insulating film thereabove is not kept, and this could cause a phenomenon called "film floating" or "film peeling" (hereinafter, collectively referred to as "film floating") in which the insulating film serving as the upper layer is peeled at an end of the transparent conductive film, in some cases.

The frequency of occurrence of this film floating is associated with a pattern density and a shape of the transparent conductive film, and is increased in a region where a pattern density of the transparent conductive film is relatively low, such as a frame region provided on the outside of a display region on the TFT array substrate, that is, in an external connection terminal part or a wiring conversion part. The inventor of the present invention has confirmed that the film floating of the insulating film on the transparent conductive film is likely to occur especially at a corner part of a pattern of the transparent conductive film arranged so as to make direct contact with the lower insulating film. Since a function of the insulating film as a protective film is lost in the portion where the film floating of the insulating film has occurred, the film floating leads to a reduction in corrosion resistance of an electrode, or occurrence of dielectric breakdown, which causes a reduction in manufacture yield of the TFT array substrate and a reduction in reliability of the TFT array substrate. Accordingly, in order to obtain a TFT array substrate having a high yield and high reliability, it is effective to take measures against the film floating of the insulating film.

In order to make the number of photoengraving steps of the FFS mode TFT array substrate equal to that of the general TN mode TFT array substrate, Japanese Patent Application No. 2010-191410 employs a configuration in which a transparent conductive film is arranged on a metal film pattern serving as a source wiring, with no insulating film interposed therebetween. In this configuration, since an area of the transparent conductive film pattern is large on the TFT array substrate, the frequency of occurrence of the film floating of the insulating film could be increased, so that the measures against the film floating becomes more important.

Moreover, according to the TFT array substrate of Japanese Patent Application No. 2010-191410, since the metal film and the transparent conductive film are required to function as the electrically same electrode or wiring, electrical connectivity between the metal film and the transparent conductive film is important. For example, preferable electrical connectivity cannot be easily obtained between a transparent electrode made of indium tin oxide (ITO) and aluminum (Al), so that a problem arises when the ITO transparent conductive film is required to be disposed on a laminated film having an uppermost layer made of an Al-based metal. The inventor of the present invention has confirmed that in the liquid crystal display device employing the TFT array substrate having the wiring structure in which ITO is arranged on Al, there is an increase in resistance in the wiring conversion part for connecting wirings of different layers of the TFT array substrate, which causes a display defect such as a line defect.

On the other hand, since an Al-based thin film has a low resistance value, the Al-based thin film is increasingly employed in a signal wiring of the TFT array substrate along with an increase in resolution and an increase in size of a screen of the liquid crystal display device. Therefore, in view of the development of the FFS mode TFT array substrate, it is important to improve the electrical connectivity between the transparent conductive film and the metal film, particularly, between the transparent conductive film and the laminated film having the Al-based thin film serving as its upper surface.

SUMMARY OF THE INVENTION

An object of the present invention is to provide a wiring structure capable of suppressing occurrence of film floating of an insulating film on a transparent conductive film, and obtaining preferable electrical connectivity between the transparent conductive film and a metal film, a TFT array substrate including the same, and a liquid crystal display device.

A wiring structure according to the present invention includes a first insulating film, a first conductive film formed on the first insulating film, and a first transparent conductive film formed on the first conductive film. The first transparent conductive film covers at least one part of an end surface of the first conductive film. An angle formed at a corner part of the first transparent conductive film in a region where the first transparent conductive film makes contact with the first insulating film is larger than 90 degrees and smaller than 270 degrees or the corner part has an arc shape.

Thus, stress is prevented from concentrating on the corner part of the first transparent conductive film, and occurrence of film floating of an insulating film provided on the first transparent conductive film can be suppressed. Further, the first transparent conductive film is connected to the end surface of the first conductive film, so that even when the electrical connectivity is poor between an uppermost layer of the first conductive film and the first transparent conductive film, preferable electrical connectivity can be obtained with another layer.

These and other objects, features, aspects and advantages of the present invention will become more apparent from the following detailed description of the present invention when taken in conjunction with the accompanying drawings.

BRIEF DESCRIPTION OF THE DRAWINGS

FIG. 6 is a sectional view of an extended portion of a source wiring of the TFT array substrate according to the first to fourth preferred embodiments;

FIG. 15 is a plan view of a wiring conversion part of the TFT array substrate according to the third preferred embodiment;

FIG. 18 is a sectional view of an extended portion of a source wiring of the TFT array substrate according to the fifth preferred embodiment;

FIG. 19 is a plan view of a wiring conversion part of a TFT array substrate according to a sixth preferred embodiment;

FIG. 20 is a sectional view of an extended portion of a source wiring of the TFT array substrate according to the sixth preferred embodiment.

DESCRIPTION OF THE PREFERRED EMBODIMENTS

Figure 1:
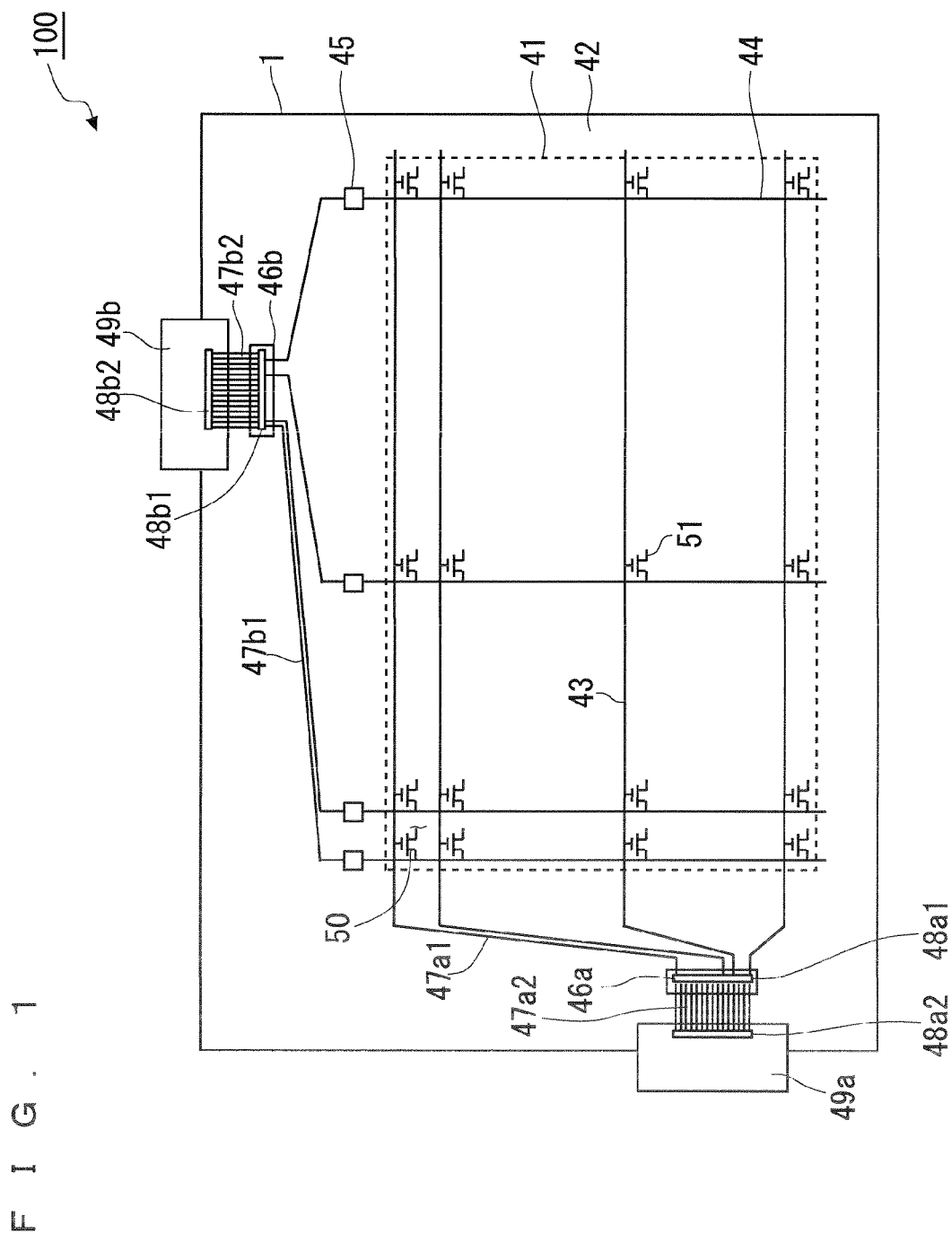
FIG. 1 is a plan view showing a configuration of a TFT array substrate employed in a liquid crystal display device according to a preferred embodiment of the present invention.

Hereinafter, preferred embodiments of the present invention will be described, but the application of the present invention is not limited thereto. For the convenience of description, the description and illustration in the drawings are appropriately omitted or simplified. For example, the drawings are schematically shown, and do not specify precise dimensions of components shown therein. Additionally, components denoted with the same reference numerals in each figure show similar components, and description thereof will not be repeated.

First Preferred Embodiment

First, there is shown a configuration example of a liquid crystal display device capable of implementing a wiring structure according to the present invention. FIG. 1 is a plan view showing a TFT array substrate 100 of the liquid crystal display device according to a preferred embodiment of the present invention. As shown in FIG. 1, the TFT array substrate 100 includes pixels 50 serving as display units of an image, which are disposed on a substrate 1 in the form of an array (matrix). Each pixel 50 is provided with a TFT 51 serving as a switching element that supplies a display voltage to a pixel electrode (not shown). A member configured by the substrate 1 equipped with the TFTs 51 is called the "TFT array substrate" because the TFTs 51 are arranged for the respective pixels 50 in the form of the array. The substrate 1 includes a glass substrate or a semiconductor substrate.

The TFT array substrate 100 has an array region 41 (region inside a rectangle shown by a dotted line in FIG. 1) in which the TFTs 51 are arranged in the form of the array, and a frame region 42 (region outside the rectangle shown by the dotted line in FIG. 1) surrounding the array region 41. In the liquid crystal display device, the array region 41 corresponds to a display region for displaying the image. Hereinafter, the array region 41 is referred to as the "display region 41".

In the display region 41 of the TFT array substrate 100, a plurality of gate wirings (scanning signal lines) 43 and a plurality of source wirings (display signal lines) 44 are provided. The plurality of gate wirings 43 extend parallel to each other, and similarly, the plurality of source wirings 44 extend parallel to each other. The gate wirings 43 and the source wirings 44 are disposed so as to intersect with each other. A region surrounded by a pair of adjacent gate wirings 43 and a pair of adjacent source wirings 44 serves as the pixel 50. Accordingly, in the display region 41, the pixels 50 are arranged in the form of the matrix.

In the frame region 42 of the TFT array substrate 100, a scanning signal drive circuit 46a, a display signal drive circuit 46b, wiring conversion parts 45, lead-out wirings 47a1, 47a2, 47b1, and 47b2, and external connection terminals 48a1, 48a2, 48b1, and 48b2 are disposed.

The gate wirings 43 extend up to the frame region 42 provided on the outside of the display region 41, and are led out to an end of the TFT array substrate 100 through the lead-out wirings 47a1 formed of the same wiring layer as the gate wirings 43. The gate wirings 43 led out through the lead-out wirings 47a1 are connected to the scanning signal drive circuit 46a through the external connection terminal 48a1.

The source wirings 44 extend up to the frame region 42 provided on the outside of the display region 41, electrically connected to the lead-out wirings 47b1 formed of the same wiring layer as the gate wirings 43 in the wiring conversion parts 45, and are led out to the end of the TFT array substrate 100 through the lead-out wirings 47b1. The source wirings 44 led out through the lead-out wirings 47b1 are connected to the display signal drive circuit 46b through the external connection terminal 48b1.

An external wiring 49a is disposed in proximity to the scanning signal drive circuit 46a, and the scanning signal drive circuit 46a and the external wiring 49a are connected to each other through the lead-out wirings 47a2 and the external connection terminal 48a2. An external wiring 49b is disposed in proximity to the display signal drive circuit 46b, and the display signal drive circuit 46b and the external wiring 49b are connected to each other through the lead-out wirings 47b2 and the external connection terminal 48b2. Each of the external wirings 49a and 49b is a circuit board such as a flexible printed circuit (FPC).

Various signals are supplied from the outside to the scanning signal drive circuit 46a through the external wiring 49a and the lead-out wirings 47a2. Various signals are supplied from the outside to the display signal drive circuit 46b through the external wiring 49b and the lead-out wirings 47b2.

The scanning signal drive circuit 46a supplies a gate signal (scanning signal) to the gate wirings 43, based on a control signal supplied from the outside. This gate signal serves as a signal that sequentially selects each of the gate wirings 43. The display signal drive circuit 46b supplies a display signal to each of the source wirings 44 in synchronization with the timing when the gate wiring 43 is selected, based on the control signal and display data supplied from the outside. By this operation, a display voltage based on the display data is supplied to each of the pixels 50.

Each of the pixels 50 is provided with at least one TFT 51. The TFT 51 is arranged in proximity to an intersection of the source wiring 44 and the gate wiring 43, and a gate electrode and a source electrode of the TFT 51 are connected to the gate wiring 43 and the source wiring 44, respectively. The TFT 51 is turned on in response to the gate signal supplied from the gate wiring 43, and a display potential supplied from the source wiring 44 is applied to the pixel electrode connected to a drain electrode.

The FFS mode TFT array substrate 100 is provided with not only the pixel electrodes but also counter electrodes (common electrodes) arranged so as to be opposed to the pixel electrodes with an insulating film interposed therebetween. Generally, the pixel electrode has a flat plate shape, and the common electrode has a comb shape (having a plurality of slits). A common potential is supplied to the counter electrode, and a fringing field occurs between the pixel electrode and the counter electrode, based on the display voltage (difference between the display potential and the common potential). A configuration of the pixel 50 will be described in detail later.

Figure 2:
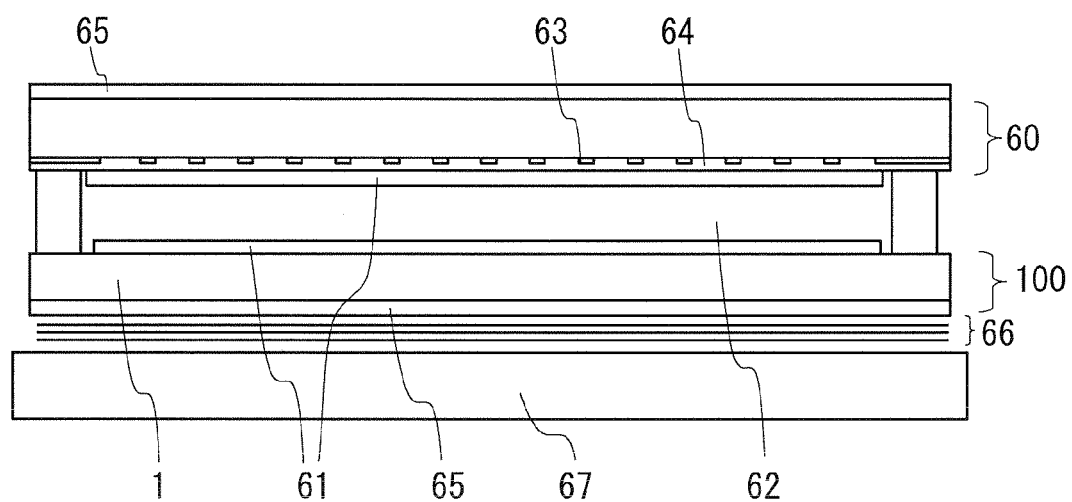
FIG. 2 is a sectional view showing the liquid crystal display device according to the preferred embodiment of the present invention.

Next, an overall configuration of the liquid crystal display device according to a first preferred embodiment will be described. FIG. 2 is a sectional view showing the overall configuration of the liquid crystal display device including the TFT array substrate 100 described above. As shown in FIG. 2, the liquid crystal display device has a structure in which a liquid crystal layer 62 is sealed between the TFT array substrate 100 and a counter substrate 60 arranged opposed to each other.

The counter substrate 60 is arranged on a front surface side (viewing side) of the liquid crystal display device with respect to the TFT array substrate 100. The counter substrate 60 is provided with a color filter 64, and black matrices (BM) 63. The counter substrate 60 is generally called a "color filter substrate".

Oriented films 61 are formed on respective surfaces of the TFT array substrate 100 and the counter substrate 60, on the sides facing the liquid crystal layer 62. Polarizing plates 65 are respectively provided on a back surface side (opposite to the viewing side) of the TFT array substrate 100 and a front surface side of the counter substrate 60. A liquid crystal display panel is configured by the TFT array substrate 100, the counter substrates 60, the liquid crystal layer 62, and the polarizing plates 65.

Further, a backlight unit 67 is arranged on a back surface side of the liquid crystal display panel with optical films 66 such as retardation films interposed therebetween, and the liquid crystal display device is configured by housing these components in a frame (not shown) made of a resin or metal.

As for light that passed through the polarizing plate 65 and became linearly polarized light, its polarization state is changed by the liquid crystal layer 62. In an FFS mode liquid crystal display device, the liquid crystal layer 62 is driven (an orientation direction of the liquid crystal layer 62 is changed) by the fringing field occurring between the pixel electrode and the counter electrode of the TFT array substrate 100, whereby the polarization state of light that passes through the liquid crystal layer 62 is changed.

More specifically, the light from the backlight unit 67 becomes linearly polarized light through the polarizing plate 65 provided on the back surface side of the liquid crystal display panel. This linearly polarized light changes its polarization state after passing through the liquid crystal layer 62, so that an amount of light passing through the polarizing plate 65 provided on a front surface side of the liquid crystal display panel is changed. That is, the amount of the light passing through the polarizing plate 65 provided on the front surface side is changed, among transmitted light emitted from the backlight unit 67 and transmitted through the liquid crystal display panel. The orientation direction of the liquid crystal layer 62 is changed according to the applied display voltage. Accordingly, the amount of the light passing through the polarizing plate 65 on the front surface side can be changed by controlling the display voltage. Therefore, a desirable image can be displayed by changing the display voltage for each pixel 50.

Figure 3:
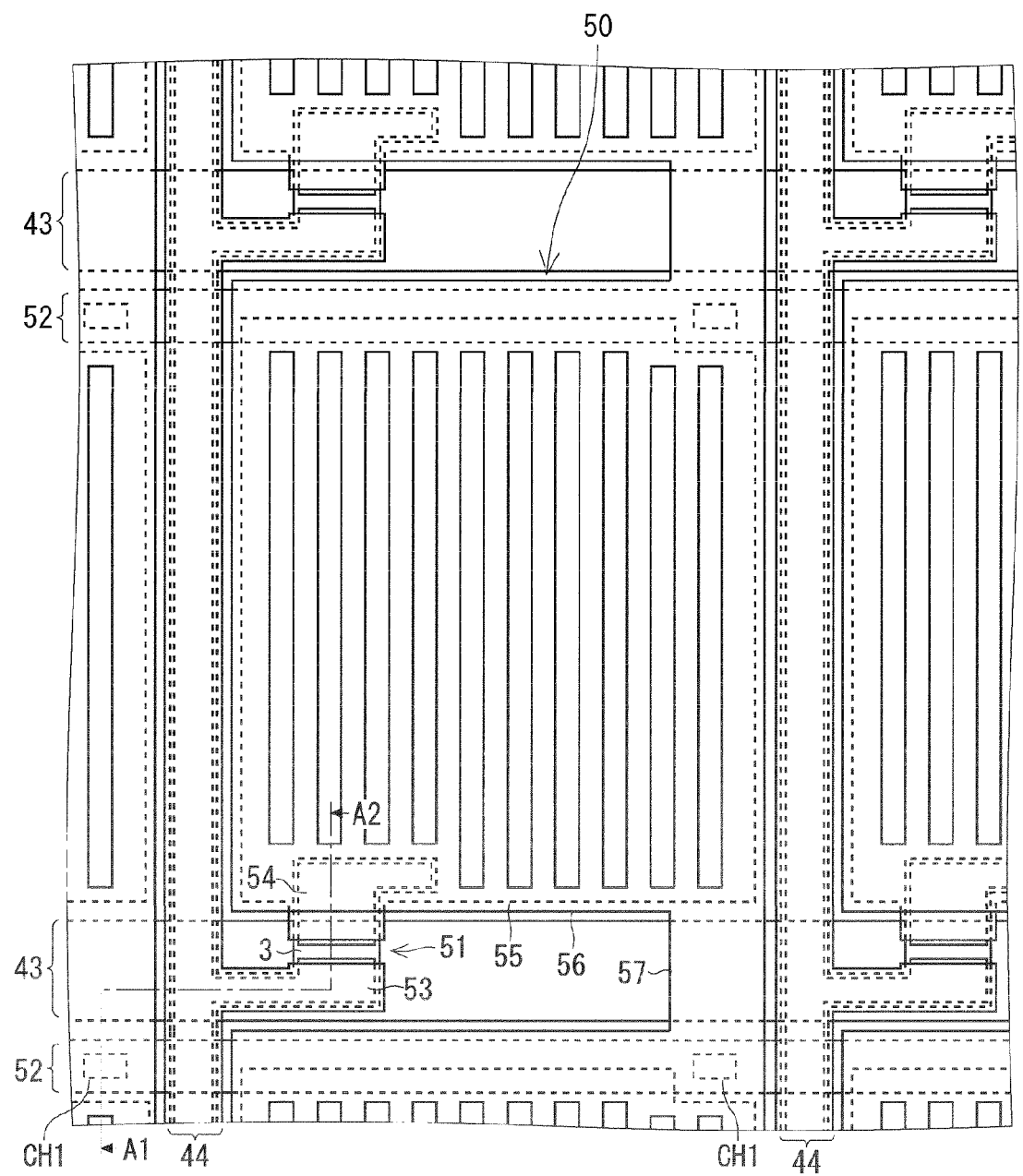
FIG. 3 is a plan view of a display region of the TFT array substrate according to the preferred embodiment of the present invention.
Figure 4:
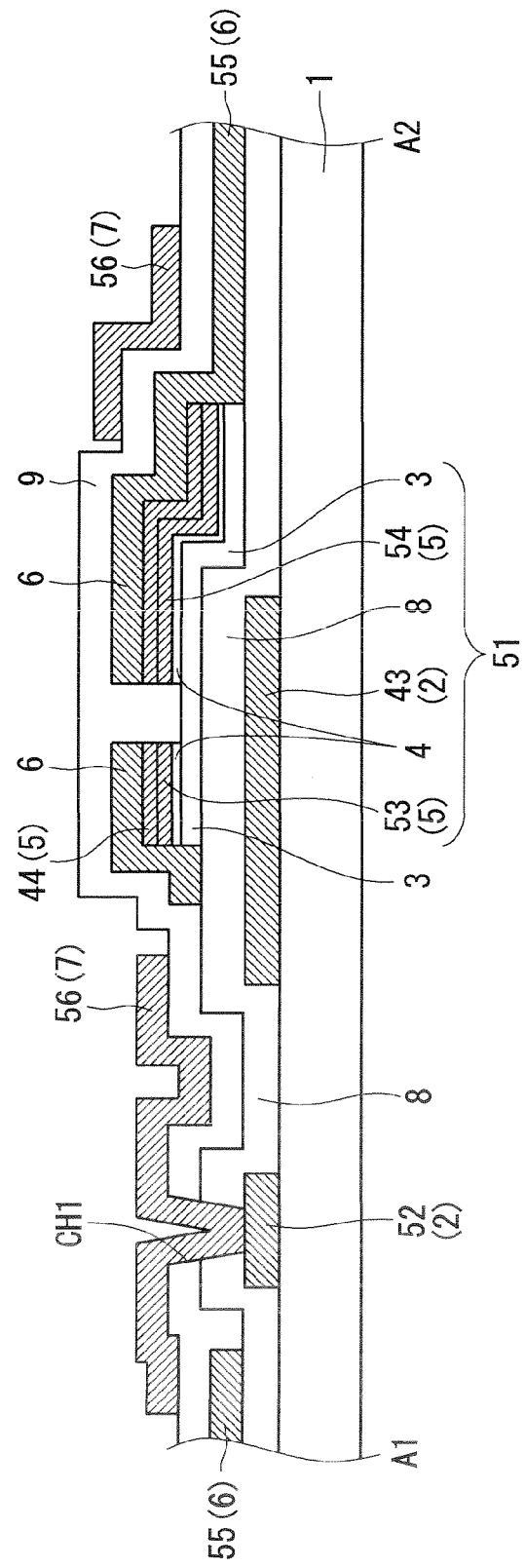
FIG. 4 is a sectional view of the display region of the TFT array substrate according to the preferred embodiment of the present invention.

Next, a detailed configuration of the display region 41 of the TFT array substrate 100 according to the first preferred embodiment will be described with reference to FIG. 3 and FIG. 4. FIG. 3 is a plan view of the pixel 50 located in proximity to a central part of the display region 41 of the TFT array substrate 100, and FIG. 4 is a sectional view taken along line A1-A2 in FIG. 3. Note that the configuration of the pixel 50 is similar to that shown in FIG. 3 and FIG. 4 except for the pixel located on an outermost periphery of the display region 41.

The plurality of gate wirings 43 connected to the gate electrodes of the TFTs 51 are formed on the substrate 1 such as the glass substrate made of an insulating material. According to the present preferred embodiment, a part of the gate wiring 43 functions as the gate electrode of the TFT 51. The plurality of gate wirings 43 are linearly disposed parallel to each other. In addition, on the substrate 1, a plurality of common wirings 52 formed of the same wiring layer as the gate wirings 43 are formed parallel to each other. The common wirings 52 are disposed between the gate wirings 43 substantially parallel to the gate wirings 43.

A conductive film constituting the gate wirings 43 (gate electrodes) and the common wirings 52 is formed of a laminated film made of a high melting point metal or low resistance metal such as Cr, Al, Ta, Ti, Mo, W, Ni, Cu, Au, or Ag, an alloy film mainly composed of these metals, or a laminated film of these metals.

A first insulating film 8 is formed on the gate wirings 43 and the common wirings 52. A part of the first insulating film 8 (portion on the gate wirings 43) functions as a gate insulating film of the TFT 51.

A semiconductor film 3 is formed on the first insulating film 8. According to the present preferred embodiment, the semiconductor film 3 is formed in the form of straight line intersecting with the gate wiring 43 to coincide with formation region of the source wiring 44 (a pattern of the semiconductor film 3 is orthogonal to the gate wirings 43 in FIG. 3). The semiconductor film 3 is formed of noncrystalline silicon, or polycrystalline silicon.

The linear semiconductor film 3 also functions as a redundant wiring of the source wiring 44. That is, even when the source wiring 44 is disconnected, interruption of an electrical signal is prevented because the semiconductor film 3 is disposed along the source wiring 44.

The semiconductor film 3 is partially branched at a portion intersecting with the gate wiring 43, extends along the gate wiring 43, and further extends to the pixel 50. The TFT 51 is formed of a portion of the semiconductor film 3 branched from the portion intersecting with the gate wiring 43. That is, a portion overlapping with the gate wiring 43 (gate electrode) in the branched semiconductor film 3 serves as an active region of the TFT 51.

An ohmic contact film 4 doped with a conductive impurity is formed on the semiconductor film 3. The ohmic contact film 4 is formed substantially on an entire surface of the semiconductor film 3, but the ohmic contact film 4 has been removed above a portion serving as a channel region of the TFT 51 (region between a source electrode 53 and a drain electrode 54). The ohmic contact film 4 is formed of n-type noncrystalline silicon or n-type polycrystalline silicon doped with an impurity such as phosphorus (P) at high concentration, for example.

In the portion of the semiconductor film 3 overlapping with the gate wiring 43, the region of the ohmic contact film 4 serves as source and drain regions. With reference to FIG. 4, in the semiconductor film 3, a region overlapping with the gate wiring 43, below the left ohmic contact film 4 serves as the source region, and a region overlapping with the gate wiring 43, below the right ohmic contact film 4 serves as the drain region. A region interposed between the source region and the drain region, of the semiconductor film 3 serves as the channel region.

The source wiring 44, the source electrode 53, and the drain electrode 54 are formed of the same wiring layer (a first conductive film 5) on the ohmic contact film 4. Specifically, the source electrode 53 is formed on the ohmic contact film 4 on the source region side, and the drain electrode 54 is formed on the ohmic contact film 4 on the drain region side of the TFT 51. The TFT 51 having such a configuration is called a "channel etching type TFT".

The source wiring 44 is formed on the semiconductor film 3 with the ohmic contact film 4 interposed therebetween, and disposed so as to linearly extend in the direction intersecting with the gate wiring 43. Although the source electrode 53 and the drain electrode 54 are separated, the source electrode 53 and the source wiring 44 are connected. That is, the source wiring 44 is branched at the portion intersecting with the gate wiring 43 and extends along the gate wiring 43, and this extended portion serves as the source electrode 53. The first conductive film 5 constituting the source wiring 44, the source electrode 53, and the drain electrode 54 is formed substantially on an entire surface of the semiconductor film 3 similarly to the ohmic contact film 4, but the first conductive film 5 is removed above the portion serving as the channel region of the TFT 51.

According to the present preferred embodiment, the first conductive film 5 serving as the source wiring 44, the source electrode 53, and the drain electrode 54 is a laminated film including an upper layer which is a metal film mainly composed of Al or an Al alloy, and a lower layer formed of a film made of a high melting point metal or low resistance metal such as Cr, Ta, Ti, Mo, W, Ni, Cu, Au, or Ag, or an alloy film mainly composed of these metals.

As can be seen from the above description, the semiconductor film 3 is disposed substantially on the entire region below the source wiring 44, the source electrode 53, and the drain electrode 54, and the region between the source electrode 53 and the drain electrode 54 located above the gate wiring 43. The ohmic contact film 4 is disposed between the source wiring 44, the source electrode 53 and the semiconductor film 3, and between the drain electrode 54 and the semiconductor film 3.

The drain electrode 54 is electrically connected to a pixel electrode 55 serving as a first transparent conductive film 6 formed substantially on an entire surface of the region of the pixel 50 (region surrounded by the source wiring 44 and the gate wiring 43). The first transparent conductive film 6 is a transparent conductive film formed of ITO. According to the present preferred embodiment, the first transparent conductive film 6 includes at least one of $In_2O_3$, ITO, IZO, ITZO, and ZnO.

As shown in FIG. 4, the pixel electrode 55 has a portion that directly overlaps with the drain electrode 54. That is, at that portion, a lower surface of the first transparent conductive film 6 serving as the pixel electrode 55 makes direct contact with an upper surface of the drain electrode 54. In addition, the first transparent conductive film 6 covers a substantially entire surface of the drain electrode 54. However, an end of the first transparent conductive film 6 on the channel region side is arranged substantially on the same position as an end of the drain electrode 54 on the channel region side, or arranged slightly backward from the end of the drain electrode 54. Therefore, an end surface of the drain electrode 54 on the channel region side is not covered with the first transparent conductive film 6. Note that the first transparent conductive film 6 is formed so as to cover an end surface of the drain electrode 54 other than the end surface on the channel region side.

Being "formed so as to cover an end surface" herein means that the upper film is formed so as to equally cover the upper surface and the end surface of the lower film, and also includes, for example, a state where the upper film cannot be sufficiently in contact with the end surface of the lower film due to irregularities on the end surface of the lower film (a state of so-called "coverage failure"). However, it does not include a state where, after the upper film has been formed so as to cover the lower film, the end surface of the lower film is intentionally exposed by processing the upper film.

Thus, according to the configuration in which the pixel electrode 55 partially directly overlaps with the drain electrode 54 with no insulating film interposed therebetween, there is no need to provide a contact hole for electrically connecting the pixel electrode 55 to the drain electrode 54, so that the number of photoengraving steps can be reduced. Additionally, since there is no need to ensure an area for the contact hole, this configuration also has an advantage of increasing an aperture ratio of each pixel 50.

The first transparent conductive film 6 serving as the same wiring layer as the pixel electrode 55 is formed so as to also directly overlap with a substantially entire surface of the source electrode 53 and the source wiring 44. An end of the first transparent conductive film 6 on the channel region side above the source electrode 53 is arranged substantially on the same position as the end of the source electrode 53 on the channel region side or arranged slightly backward from the end of the source electrode 53. Therefore, the end of the source electrode 53 on the channel region side is not covered with the first transparent conductive film 6. Note that the first transparent conductive film 6 is formed so as to cover an end surface of the source electrode 53 other than the end surface on the channel region side.

The first transparent conductive film 6 on the source electrode 53 and the first transparent conductive film 6 (pixel electrode 55) on the drain electrode 54 are spaced apart. That is, the first transparent conductive film 6 is not provided over the channel region of the semiconductor film 3.

As shown in FIG. 4, the source wiring 44 is formed of the first conductive film 5 which is the same as the source electrode 53 and the drain electrode 54. The semiconductor film 3 is disposed substantially on the entire surface under the source wiring 44, and the ohmic contact film 4 is formed between the source wiring 44 and the semiconductor film 3.

The source wiring 44, the ohmic contact film 4, and the semiconductor film 3 are covered with the first transparent conductive film 6 which is the same layer as the pixel electrode 55, and the first transparent conductive film 6 protrudes from a width of the source wiring 44 to cover the end surface of the source wiring 44. Although FIG. 4 shows only one end surface (left end surface) of the source wiring 44, the other end surface thereof is also covered with the first transparent conductive film 6 protruding from the width of the source wiring 44.

Thus, the first transparent conductive film 6 that is the same layer as the pixel electrode 55 is formed substantially on the entire surface of the source wiring 44, the source electrode 53, and the drain electrode 54 which are formed of the first conductive film 5. Particularly, the first transparent conductive film 6 on the source wiring 44 also functions as the redundant wiring of the source wiring 44. That is, even when the source wiring 44 is disconnected, an electrical signal is prevented from being isolated because the first transparent conductive film 6 is disposed along the source wiring 44.

As shown in FIG. 4, the first transparent conductive film 6 including the pixel electrode 55 is covered with a second insulating film 9. A counter electrode 56 serving as a second transparent conductive film 7 is formed on the second insulating film 9. According to the present preferred embodiment, the second transparent conductive film 7 includes at least one of In$_2$O$_3$, ITO, IZO, ITZO, and ZnO.

The second insulating film 9 functions as a protective film of the TFT 51, and also functions as an interlayer dielectric film between the pixel electrode 55 and the counter electrode 56. The second insulating film 9 includes an insulating film formed of a silicon nitride or silicon oxide, a coating type insulating film (formed by coating), or a laminated film thereof.

The counter electrode 56 is arranged so as to be opposed to the pixel electrode 55 with the second insulating film 9 interposed therebetween, and is provided with slits for generating the fringing field between the counter electrode 56 and the pixel electrode 55. As shown in FIG. 3, a plurality of slits of the counter electrode 56 are provided substantially parallel to the source wirings 44. In other words, the counter electrode 56 has the comb shape by the presence of the slits. As described above, according to the FFS mode liquid crystal display device, the liquid crystal is driven by the fringing field generated between the pixel electrode 55 and the counter electrode 56.

The counter electrode 56 is electrically connected to the common wiring 52, to which a common potential is supplied, through a contact hole CH1 penetrating through the second insulating film 9 and the first insulating film 8. In addition, the counter electrode 56 is integrally formed so as to be connected to the other counter electrode 56 of the adjacent pixel 50 across the gate wiring 43. That is, the counter electrodes 56 of the pixels 50 which are adjacent to each other across the gate wirings 43 are coupled by a counter electrode coupling part 57 serving as the same wiring layer (second transparent conductive film 7) as the counter electrodes 56. Herein, the counter electrode coupling part 57 is formed so as to bridge over the gate wiring 43, in a region where it does not overlap with the source wiring 44 and the TFT 51. That is, the second transparent conductive film 7 is formed so as to partially overlap with the gate wiring 43.

Figure 5:
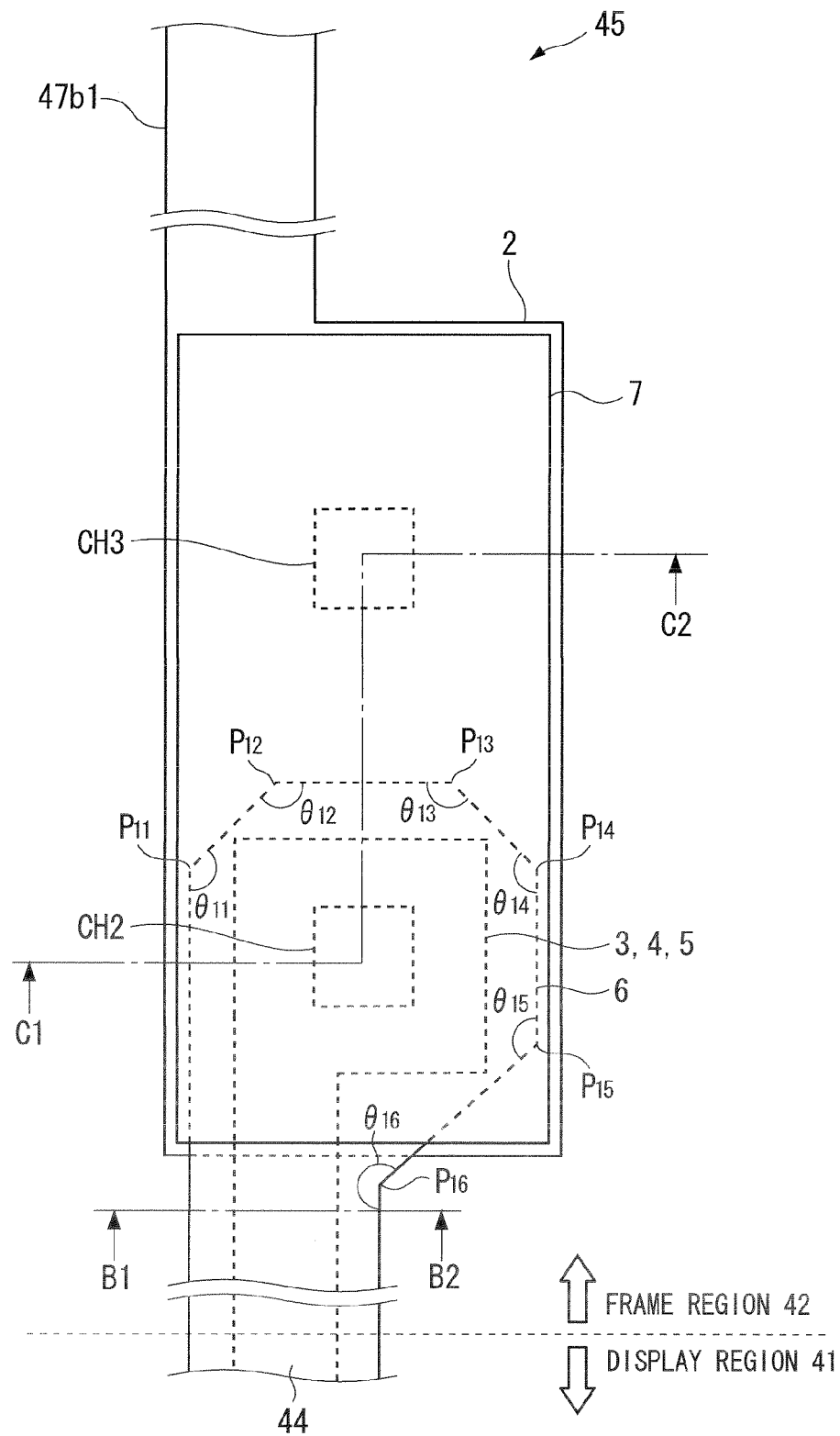
FIG. 5 is a plan view of a wiring conversion part of a TFT array substrate according to a first preferred embodiment.
Figure 7:
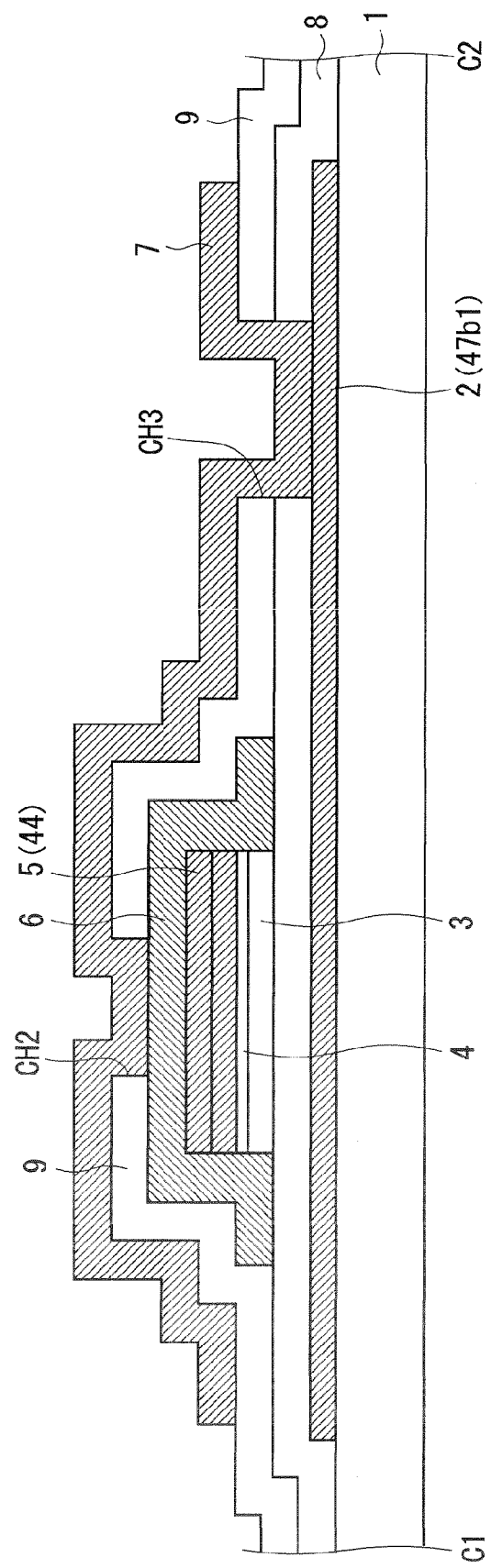
FIG. 7 is a sectional view of the wiring conversion part of the TFT array substrate according to the first to fifth preferred embodiments.

Next, a configuration of the wiring conversion part 45 provided on the TFT array substrate 100 of the liquid crystal display device according to the first preferred embodiment will be described with reference to FIG. 5 to FIG. 7. FIG. 5 is a plan view of the wiring conversion part 45, FIG. 6 is a sectional view taken along line B1-B2 in FIG. 5, and FIG. 7 is a sectional view taken along line C1-C2 in FIG. 5. In addition, the cross section taken along line B1-B2 corresponds to one part of the source wiring 44 (extended portion) led out up to the frame region 42.

In FIG. 5 to FIG. 7, elements formed of the same layer as shown in FIG. 3 and FIG. 4 are marked with the same reference numerals. For example, a lower conductive film 2 (second conductive film) in FIG. 5 to FIG. 7 is the same layer as the gate wiring 43. Similarly, the first insulating film 8 in FIG. 5 to FIG. 7 is the same layer as the first insulating film 8 in FIG. 4 which serves as the gate insulating film of the TFT 51. Further, the semiconductor film 3 in FIG. 5 to FIG. 7 is the same layer as the semiconductor film 3 in FIG. 4 which serves as the active region of the TFT 51. The same is true for the other elements such as the ohmic contact film 4, the first conductive film 5, the first transparent conductive film 6, the second transparent conductive film 7, and the second insulating film 9.

As shown in FIG. 5, the wiring conversion part 45 is disposed in the frame region 42 of the TFT array substrate 100. The lead-out wiring 47b1 connected to the display signal drive circuit 46b shown in FIG. 1 is the same layer as the gate wiring 43, and is drawn into the wiring conversion part 45. An extended portion of the source wiring 44 which serves as the first conductive film 5 is drawn from the display region 41 into the wiring conversion part 45.

As shown in FIG. 6, in the extended portion of the source wiring 44, the ohmic contact film 4 and the semiconductor film 3 are formed on a lower side of the source wiring 44 (first conductive film 5), and the first transparent conductive film 6 which is the same layer as the pixel electrode 55 is formed on an upper side of the first conductive film 5. The semiconductor film 3, the ohmic contact film 4, the first conductive film 5, and the first transparent conductive film 6 are stacked on the first insulating film 8.

In the extended portion of the source wiring 44, ends of the semiconductor film 3, the ohmic contact film 4, and the first conductive film 5 are arranged substantially on the same position, and the ends thereof are arranged further inside the end of the first transparent conductive film 6. That is, the semiconductor film 3, the ohmic contact film 4, and the first conductive film 5 are formed to have slightly narrower widths than a width of the first transparent conductive film 6. Accordingly, the end surfaces of the semiconductor film 3, the ohmic contact film 4, and the first conductive film 5 are covered with the first transparent conductive film 6. In addition, the second insulating film 9 is formed on the first transparent conductive film 6.

Next, a configuration of the wiring conversion part 45 for connecting the lead-out wiring 47b1 serving as the same layer as the gate wiring 43 to the extended portion of the source wiring 44 serving as the first conductive film 5 will be described.

As shown in FIG. 7, the lower conductive film 2 serving as the lead-out wiring 47b1 is drawn into the wiring conversion part 45. The first insulating film 8 is formed on the lower conductive film 2.

The extended portion of the source wiring 44 having the structure shown in FIG. 6 is also drawn onto the first insulating film 8 located in the wiring conversion part 45. That is, in the wiring conversion part 45, a laminated structure of the semiconductor film 3, the ohmic contact film 4, the first conductive film 5, and the first transparent conductive film 6 is formed on the first insulating film 8.

Also in the wiring conversion part 45, the ends of the semiconductor film 3, the ohmic contact film 4, and the first conductive film 5 are disposed in substantially the same position, and the end of the first transparent conductive film 6 is positioned on the outside of the ends. Thus, the end surfaces of the semiconductor film 3, the ohmic contact film 4, and the first conductive film 5 are covered with the first transparent conductive film 6.

On an upper layer of the first transparent conductive film 6, the second insulating film 9 is formed. In the wiring conversion part 45, a contact hole CH2 is formed in the second insulating film 9 so as to reach the first transparent conductive film 6. In addition, a contact hole CH3 is formed in the first insulating film 8 and the second insulating film 9 so as to reach the lower conductive film 2.

Thus, the second transparent conductive film 7 serving as the same layer as the counter electrode 56 is formed on the second insulating film 9 so as to bridge over the contact hole CH2 and the contact hole CH3. The second transparent conductive film 7 is connected to the first transparent conductive film 6 through the contact hole CH2, and connected to the lower conductive film 2 through the contact hole CH3. The lower conductive film 2 and the first transparent conductive film 6 are electrically connected through the second transparent conductive film 7. As a result, the lead-out wiring 47b1 serving as the lower conductive film 2 and the source wiring 44 serving as the first conductive film 5 are electrically connected.

As described above, the wiring conversion parts 45 of the first preferred embodiment is configured with the two transparent conductive films. The FFS mode TFT array substrate 100 inevitably includes the two transparent conductive films (the pixel electrode 55 and the counter electrode 56). Therefore, when the first transparent conductive film 6 serving as the same layer as the pixel electrode 55, and the second transparent conductive film 7 serving as the same layer as the counter electrode 56 are used as the two transparent conductive films in the wiring conversion part 45, the wiring conversion part 45 can be formed without increasing the number of manufacturing steps (specific forming steps will be described later).

As described above, the inventor of the present invention has confirmed that the film floating of the insulating film on the transparent conductive film is likely to occur especially at the corner part of the pattern of the transparent conductive film arranged so as to make direct contact with the lower insulating film, in the region in which the pattern density of the transparent conductive film is low, such as the wiring conversion part.

According to the wiring conversion part 45 of the present preferred embodiment, as shown in FIG. 5, the first transparent conductive film 6 is formed into a pattern in which an angle formed at a corner part in a portion making direct contact with the first insulating film 8 (a portion provided on an outside of the width of the first conductive film 5) in the first transparent conductive film 6 is larger than 90 degrees and smaller than 270 degrees. As to the wiring conversion part 45 shown in FIG. 5, the first transparent conductive film 6 has six corner parts $P_{11}$, $P_{12}$, $P_{13}$, $P_{14}$, $P_{15}$ and $P_{16}$, in the portion making direct contact with the first insulating film 8, and all of angles $\theta_{11}$, $\theta_{12}$, $\theta_{13}$, $\theta_{14}$, $\theta_{15}$, and $\theta_{16}$ formed at the corner parts are respectively larger than 90 degrees and smaller than 270 degrees.

When each angle of the corner part of the first transparent conductive film 6 sandwiched by the first insulating film 8 and the second insulating film 9 is formed to be larger than 90 degrees and smaller than 270 degrees, stress is prevented from concentrating on each corner part. In addition, when the angle formed at the corner part of the first transparent conductive film 6 is larger than 90 degrees and smaller than 270 degrees, the number of the corner parts of the pattern of the first transparent conductive film 6 is increased compared with a case where the angle formed at the corner part is 90 degrees or less, so that the generated stress is dispersed without concentrating on the one corner part. Because of this effect, the second insulating film 9 is prevented from floating on the first transparent conductive film 6, which contributes to an improvement in yield.

In addition, the effect of the disperse in stress is increased as the number of the corner parts is increased, but it is not necessary to uselessly increase the number of the corner parts, so that the angle formed at the corner part is preferably between 90 degrees and 180 degrees.

Furthermore, the first transparent conductive film 6 in the wiring conversion part 45 is in contact with the end surfaces of the semiconductor film 3, the ohmic contact film 4, and the first conductive film 5. Thus, in the case where the first conductive film 5 is the laminated film, the first transparent conductive film 6 can be connected not only to its uppermost layer but also to a lower layer.

Therefore, even when the electrical connectivity is not good between the uppermost layer of the first conductive film 5 serving as the laminated film and the first transparent conductive film 6, as long as at least the metal film of the lower layer of the first conductive film 5 is formed of a material having preferable electrical conductivity with the first transparent conductive film 6, preferable electrical connectivity can be provided between the first conductive film 5 and the first transparent conductive film 6. For example, in the case of the first conductive film 5 having the two-layer structure, even when its upper layer is an Al-based metal film, and the first transparent conductive film 6 is formed of ITO, preferable electric connectivity can be provided between the first conductive film 5 and the first transparent conductive film 6 by using a material having preferable electric conductivity with ITO for the lower layer of the first conductive film 5. Thus, the number of options for a wiring material is increased. The same effect can be obtained when the first transparent conductive film 6 includes any of $In_2O_3$, IZO, ITZO, and ZnO.

Next, a method of manufacturing the liquid crystal display device according to the first preferred embodiment will be described with reference to FIG. 8 to FIG. 13. FIG. 8 to FIG. 13 are sectional views showing manufacturing steps of the TFT array substrate 100 according to the first preferred embodiment. In each of these figures, the display region 41 where the TFT 51 is formed is shown in a left side, while the frame region 42 where the wiring conversion part 45 is formed is shown in a right side.

First, a conductive film is formed on an entire surface of the substrate 1 made of a transparent insulating material such as glass by a sputtering method or an evaporation method. Examples of materials of this conductive film include a film formed of Cr, Al, Ta, Ti, Mo, W, Ni, Cu, Au, or Ag, an alloy film mainly composed of these elements, or a laminated film made of at least two of these elements.

Secondly, a resist is coated, exposed through a photomask, and exposed to light. The exposed resist is developed and patterned, whereby a resist pattern is formed. Hereinafter, the series of steps for forming the resist pattern is called a "photolithography step".

Then, the conductive film is patterned by etching with this resist pattern used as a mask, and the resist pattern is removed. Hereinafter, the patterning step performed with the resist pattern is called a "microfabrication step".

Figure 8:
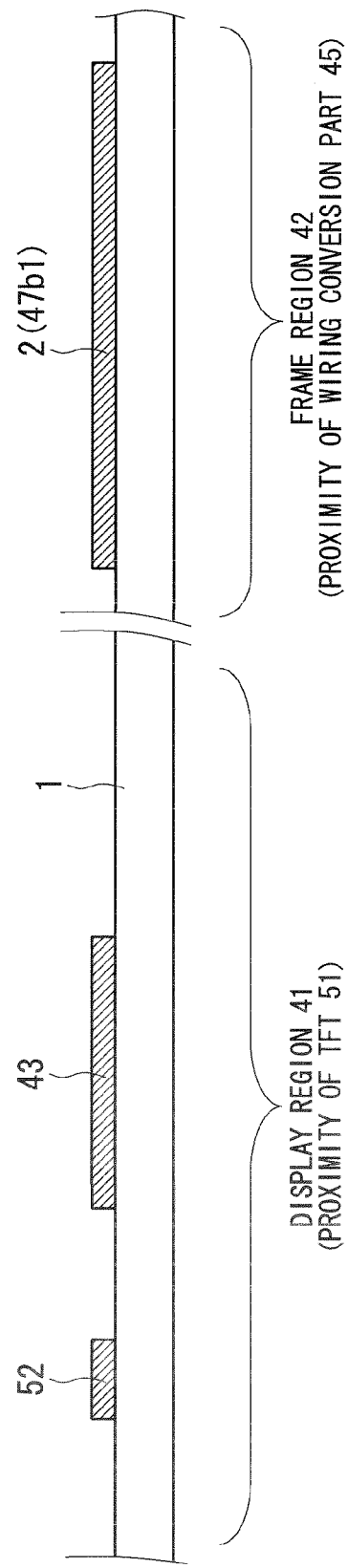
FIG. 8 to FIG. 13 are process diagrams for illustrating a method of manufacturing the TFT array substrate according to the first to fifth preferred embodiments.

As a result, as shown in FIG. 8, a pattern of the lower conductive film including the gate wiring 43 (gate electrode) and the common wiring 52 is formed. Specifically, the gate wiring 43 and the common wiring 52 are formed in the display region 41, while the lead-out wiring 47b1 drawn into the wiring conversion part 45 is formed in the frame region 42.

Thereafter, the first insulating film 8, the semiconductor film 3, and the ohmic contact film 4 are formed in this order on the entire surface of the substrate 1 by plasma CVD, atmospheric pressure CVD, or low pressure CVD so as to cover the pattern of the conductive film.

As the first insulating film 8, a material such as silicon nitride or silicon oxide is employed. Since the first insulating film 8 also functions as the gate insulating film, the film is preferably formed in a plurality of steps, for the purpose of preventing short circuit caused by a film defect such as a pinhole. As the semiconductor film 3, a material such as amorphous silicon or polycrystal polysilicon may be employed. Further, as the ohmic contact film 4, a material such as n-type amorphous silicon or n-type polycrystalline silicon to which an impurity such as phosphorus (P) is added at high concentration may be employed.

Then, the first conductive film 5 is formed on the formed ohmic contact film 4 by the sputtering method or the evaporation method. As the first conductive film 5, a laminated film formed of Cr, Al, Ta, Ti, Mo, W, Ni, Cu, Au, or Ag, or an alloy film mainly composed of these elements may be employed.

Thereafter, the first conductive film 5 is patterned through the photolithography step and the microfabrication step. Thus, patterns of the source wiring 44, the source electrode 53, and the drain electrode 54 are formed in the display region 41. However, the source electrode 53 and the drain electrode 54 are not separated at this stage (that is, the first conductive film 5 remains on the channel region of the semiconductor film 3).

Figure 9:
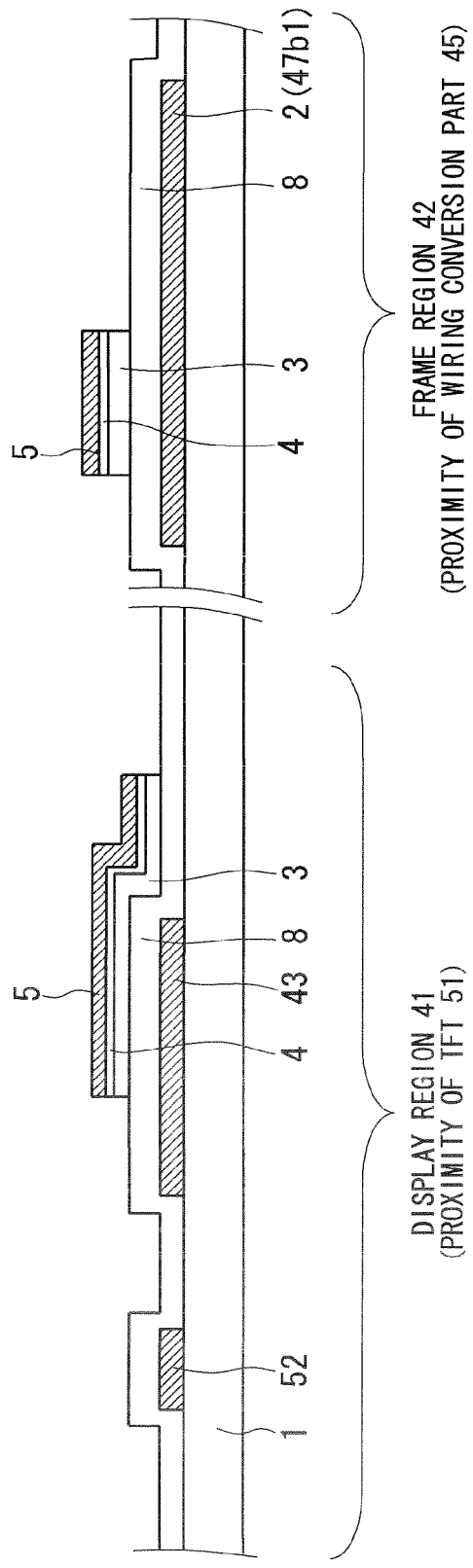

Then, the ohmic contact film 4 and the semiconductor film 3 are etched away with the patterned first conductive film 5 used as a mask, or with the resist pattern which has been used in patterning the first conductive film 5 as the mask, (that is, under the condition that the resist pattern used in patterning the first conductive film 5 remains thereon). Thus, as shown in FIG. 9, the ohmic contact film 4 and the semiconductor film 3 are removed except for the portion covered with the first conductive film 5. As a result, the semiconductor film 3 and the ohmic contact film 4 are patterned into the same shape as the first conductive film 5.

Thus, the patterning of the first conductive film 5, and the patterning of the ohmic contact film 4 and the semiconductor film 3 are continuously performed in one photolithography step.

Figure 10:
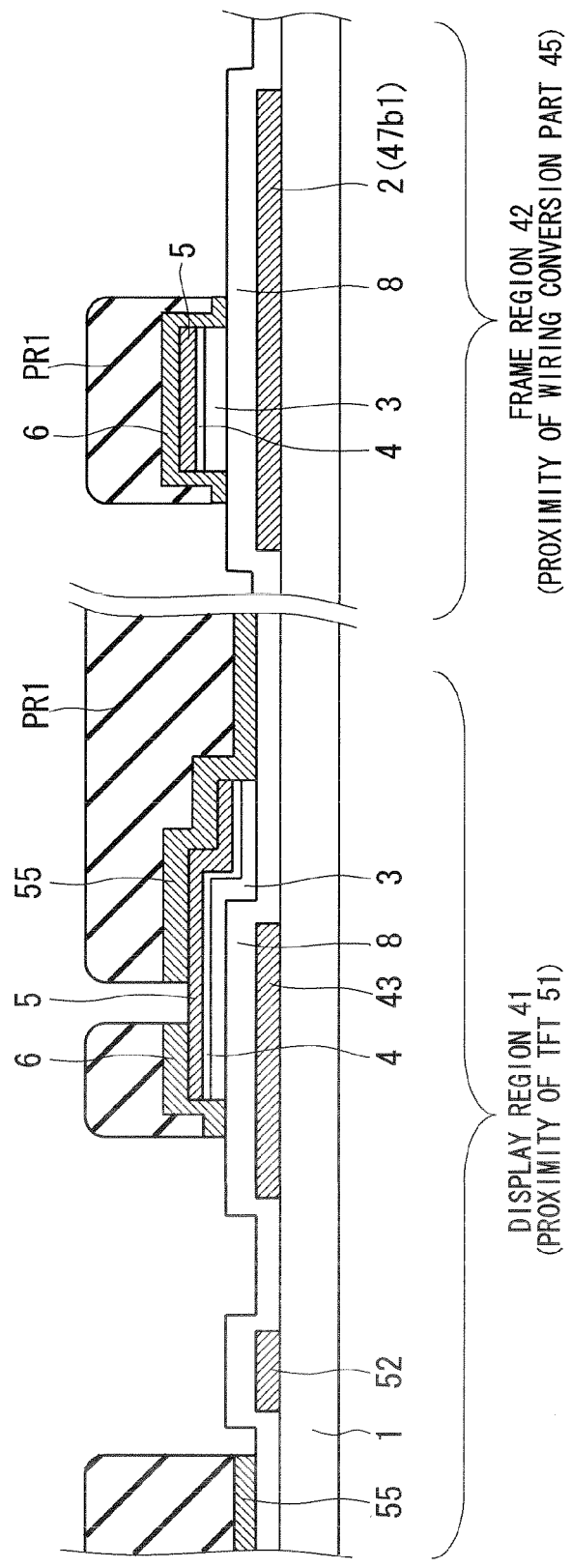

Next, a transparent conductive film made of ITO or the like is formed on the entire surface of the substrate 1 by the sputtering method. According to the present preferred embodiment, the film is formed of a general ITO in a non-crystalline state. Then, a resist pattern PR1 is formed by the photolithography step, and the transparent conductive film is patterned in the microfabrication step performed using the resist pattern PR1. Consequently, the first transparent conductive film 6 is formed as shown in FIG. 10. In this patterning process, wet etching with an etchant of weak acid such as oxalic acid suitable for etching of non-crystalline ITO may be employed.

Through this step, in the display region 41, the first transparent conductive film 6 and the pixel electrode 55 covering the first conductive film 5 are formed. As shown in FIG. 10, the transparent conductive film over the channel region of the semiconductor film 3 is removed at this time (that is, the first transparent conductive film 6 is separated into the source region side and the drain region side). The arrangement and the shape of the first transparent conductive film 6 including the pixel electrode 55 are established in this step.

Also in the frame region 42, the first transparent conductive film 6 is formed on the first conductive film 5. At this time, the end of the first transparent conductive film 6 is positioned on the outside of the ends of the semiconductor film 3, the ohmic contact film 4, and the first conductive film 5. In addition, the first transparent conductive film 6 is formed in such a manner that the angle formed at the corner part of the first transparent conductive film 6 is larger than 90 degrees and smaller than 270 degrees, in the portion where the first transparent conductive film 6 makes contact with the first insulating film 8 (portion on the outside of the width of the first conductive film 5).

Figure 11:
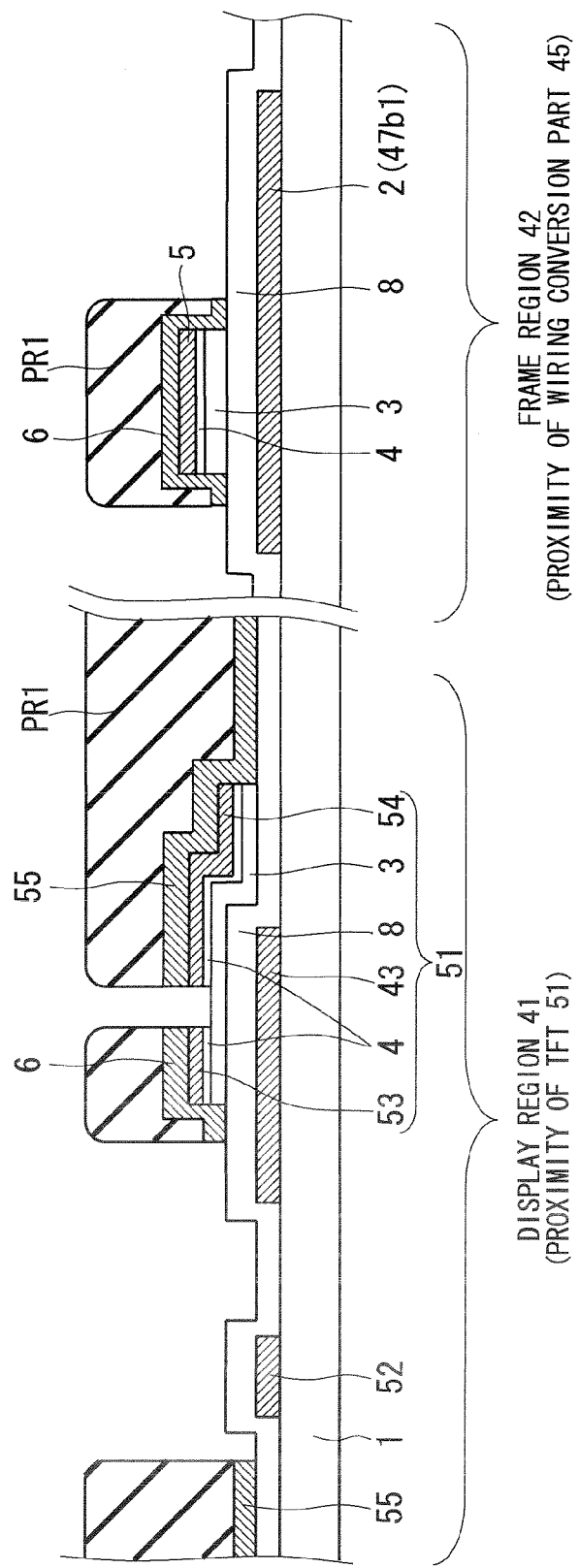

Then, the first conductive film 5 and the ohmic contact film 4 over the channel region are sequentially removed by etching with the resist pattern PR1 used as a mask. As the first conductive film 5 and the ohmic contact film 4 over the channel region are etched away, the first conductive film 5 is separated into the source electrode 53 and the drain electrode 54. Thus, as shown in FIG. 11, the semiconductor film 3 serving as the channel region of the TFT 51 is exposed between the source electrode 53 and the drain electrode 54, and the configuration of the TFT 51 is completed.

Figure 12:
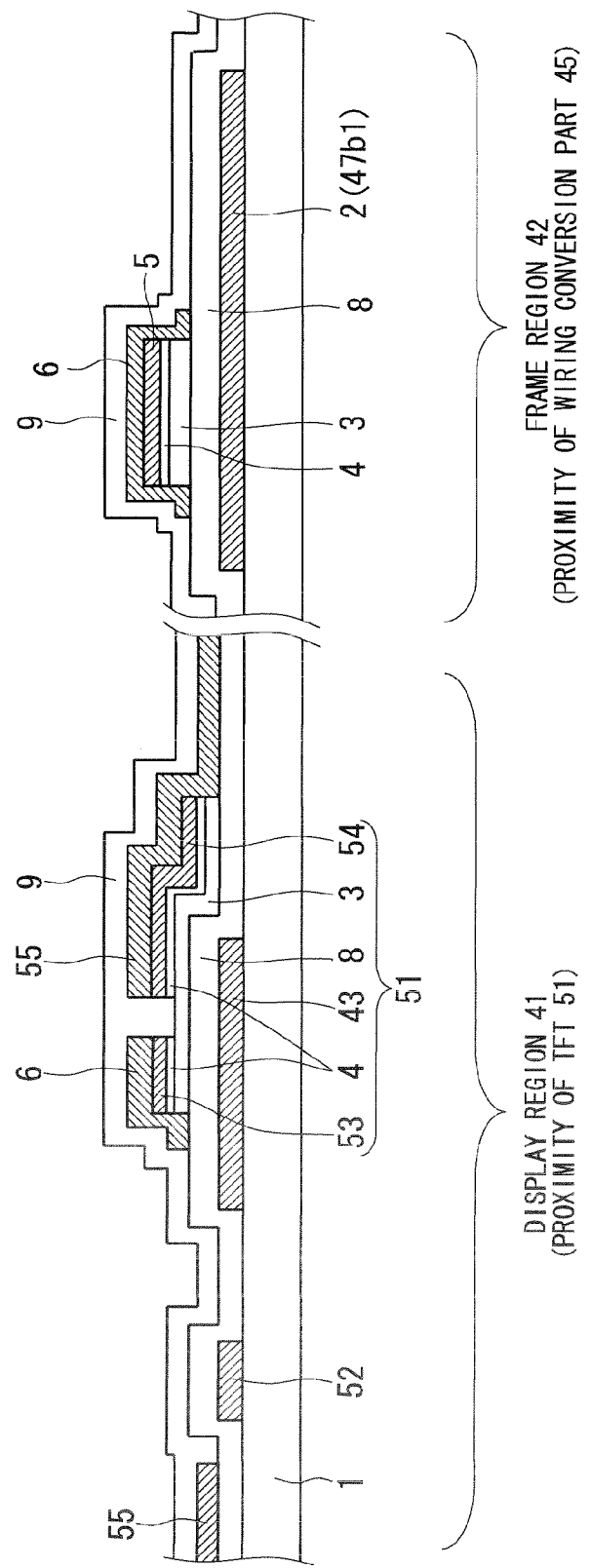

After the resist pattern PR1 is removed, the second insulating film 9 is formed on the entire surface of the substrate 1 as shown in FIG. 12. Thus, the first transparent conductive film 6 including the pixel electrode 55, and the channel region of the semiconductor film 3 are covered with the second insulating film 9. As the second insulating film 9, for example, an inorganic insulating film formed of a silicon nitride or silicon oxide may be employed, and as a film forming method, a method such as CVD method may be employed. Alternatively, the second insulating film 9 may be a laminated film further having a coating type insulating film (formed by coating) formed on the inorganic insulating film formed of silicon nitride or silicon oxide.

As described above, according to the present preferred embodiment, the angle formed at the corner part of the first transparent conductive film 6 in the frame region 42 (wiring conversion part 45) is larger than 90 degrees and smaller than 270 degrees, so that the stress is prevented from concentrating on the ends in the proximity of the corner part of the first transparent conductive film 6 after the second insulating film 9 has been formed. As a result, the film floating of the second insulating film 9 is prevented.

Accordingly, as to a film forming condition of the second insulating film 9, even under a condition that is not specialized in prevention of film floating, such as a film forming condition for improving the transmittance of the first transparent conductive film 6, or a film forming condition for enabling a preferable contact end surface shape to be formed on the first transparent conductive film 6 when the contact hole CH2 is formed in the second insulating film 9, the frequency of occurrence of the film floating can be reduced. In addition, as to a film forming condition of the first transparent conductive film 6, when a film forming condition for improving the transmittance is used, the frequency of occurrence of the film floating of the second insulating film 9 could be increased. However, due to the above configuration, the frequency of occurrence of the film floating can be reduced.

Examples of the film forming conditions of the second insulating film 9 for improving the transmittance of the first transparent conductive film 6 include a film forming condition having a high oxygen content in a material gas at the time of film formation, more specifically, a film forming condition for forming a silicon oxide film, and a film forming condition for forming a silicon nitride film containing oxygen. On the other hand, examples of the film forming conditions of the second insulating film 9 for enabling the excellent contact end surface shape to be formed in the first transparent conductive film 6 when the contact hole CH2 is formed in the second insulating film 9, include a film forming condition having a high nitrogen content in a material gas at the time of film formation of a silicon nitride, more specifically, a film forming condition in which a division ratio of nitrogen gas or ammonia gas in the material gas at the time of film formation is 2 or more with respect to a gas containing silicon (silane gas, disilane gas, TEOS gas, or the like).

Furthermore, an example of the film forming condition for improving the transmittance of the first transparent conductive film 6 formed of ITO includes selection of a condition for having the high oxygen concentration at the time of film formation by the sputtering method or the like. The film forming conditions of the second insulating film 9 and the first transparent conductive film 6 may be selected according to the usage purpose of the TFT array substrate 100.

Then, the contact holes CH1 to CH3 are formed in the second insulating film 9 and first insulating film 8 through the photolithography step and the microfabrication step. Thus, in the display region 41, the contact hole CH1 reaching the common wiring 52 is formed. In the frame region 42, the contact hole CH2 reaching the first transparent conductive film 6 and the contact hole CH3 reaching the lower conductive film 2 are formed.

Figure 13:
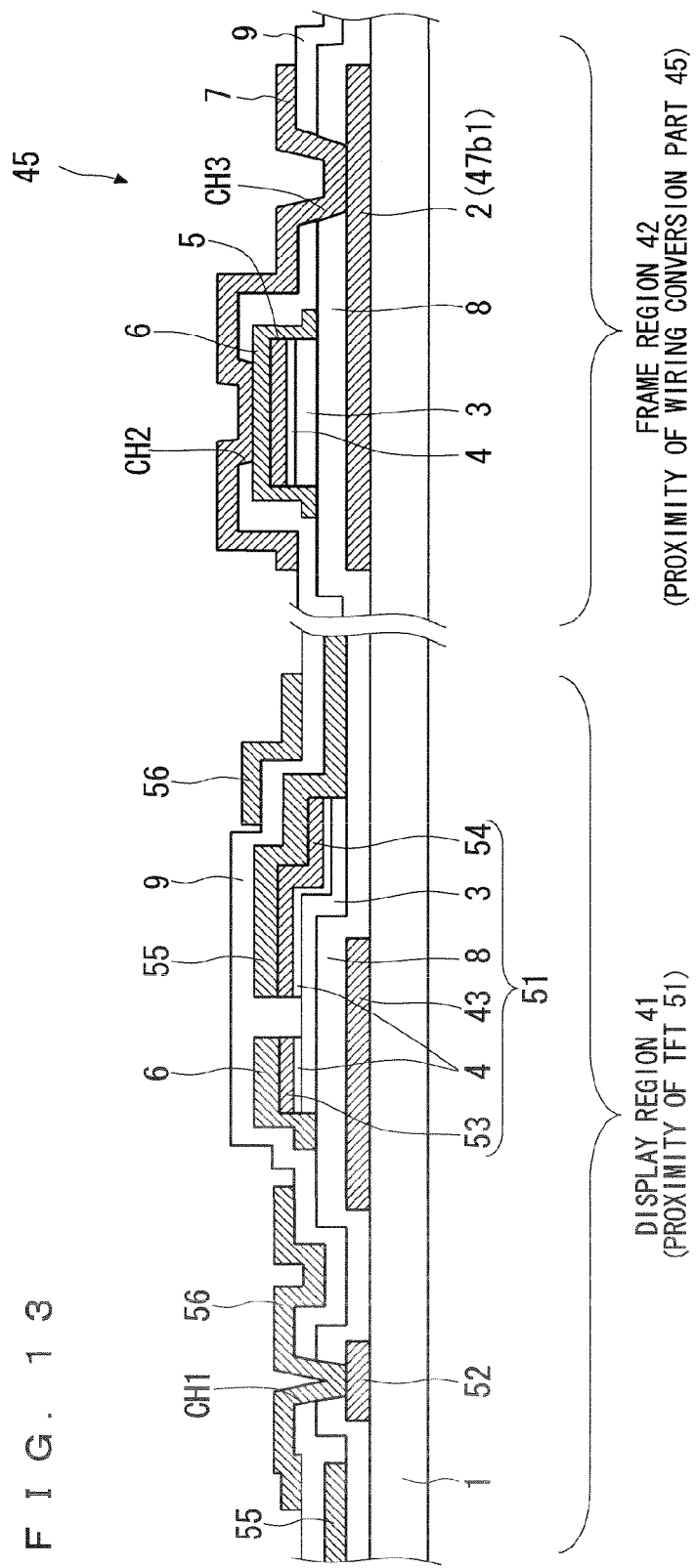

Then, a transparent conductive film is formed of ITO on the second insulating film 9 over the entire surface of the substrate 1 by the sputtering method or the like. Then, this transparent conductive film is patterned through the photolithography step and the microfabrication step to form the second transparent conductive film 7. Thus, as shown in FIG. 13, the counter electrode 56 is formed so as to be opposed to the pixel electrode 55 in the display region 41. The counter electrode 56 is formed so as to be connected to the common wiring 52 through the contact hole CH1. In the frame region 42, the second transparent conductive film 7 is formed so as to electrically connect the lower conductive film 2 to the first transparent conductive film 6 through the contact hole CH2 and the contact hole CH3.

In addition, the external connection terminal 48*b*1 disposed in the frame region 42 shown in FIG. 1 is configured by the second transparent conductive film 7 connected to the lead-out wiring 47*b*1 serving as the lower conductive film 2 through the contact hole. This external connection terminal 48*b*1 is formed at the same time as the wiring conversion part 45.

The TFT array substrate 100 of the first preferred embodiment is completed through the steps described above.

The oriented films 61 are respectively formed on the completed TFT array substrate 100, and on the separately prepared counter substrate 60, and the oriented films 61 are subjected to orientation treatment for unidirectionally putting minute scratches on surfaces in contact with the liquid crystal, by a method such as rubbing. Then, a seal material is coated on a peripheral part of the TFT array substrate 100 or the counter substrate 60, and the TFT array substrate 100 and the counter substrate 60 are bonded together such that the respective oriented films 61 face each other with a predetermined space provided therebetween. Thereafter, liquid crystal is injected between the TFT array substrate 100 and the counter substrate 60 by a method such as vacuum injection method and then sealed. Then, the TFT array substrate 100 and the counter substrate 60 are both bonded with the polarizing plates 65, and connected to a drive circuit, whereby the liquid crystal display panel is formed.

Thereafter, the backlight unit 67 is disposed on the rear surface side of the TFT array substrate 100, that is, on the back surface side of the liquid crystal display panel, with the optical films 66 such as retardation films interposed therebetween, and these components are housed in the frame made of resin or metal, whereby the liquid crystal display device is completed.

According to the liquid crystal display device of the first preferred embodiment, in the wiring conversion part 45 disposed in the frame region 42 having the relatively low pattern density of the transparent conductive film, the angle formed at the corner part of the first transparent conductive film 6 in the portion where the first transparent conductive film 6 makes contact with the first insulating film 8 is larger than 90 degrees and smaller than 270 degrees, so that the film floating of the second insulating film 9 covering the first transparent conductive film 6 is prevented from occurring.

Furthermore, in the wiring conversion part 45, the end surface of the first conductive film 5 is covered with the first transparent conductive film 6, so that the first transparent conductive film 6 is connected not only to the uppermost layer but also to the lower metal layer of the first conductive film 5. Therefore, even when the electrical connectivity is poor between the uppermost layer of the first conductive film 5 and the first transparent conductive film 6, as long as the electrical connectivity is good between the lower layer of the first conductive film 5 and the first transparent conductive film 6, preferable electrical connectivity can be obtained between the first conductive film 5 and the first transparent conductive film 6.

In the above description, the end of the first conductive film 5 is entirely covered with the first transparent conductive film 6 (the first conductive film 5 is enclosed in the first transparent conductive film 6 in a planar view), in the wiring conversion part 45 shown in FIG. 5, but as long as the preferable electrical connectivity can be ensured between the first transparent conductive film 6 and the first conductive film 5, there may exist a portion in which the end surface of the first conductive film 5 is not covered with the first transparent conductive film 6. For example, the first transparent conductive film 6 may only cover two sides of the first conductive film 5, or only cover one part of each side thereof. In this case, in the wiring conversion part 45, since the portion in which the first transparent conductive film 6 makes contact with the first insulating film 8 is relatively reduced, the generation of stress is reduced in the first transparent conductive film 6, and the effect of preventing the film floating of the second insulating film 9 can be improved. That is, according to the present preferred embodiment, the configuration in which the end surface of the first conductive film 5 is covered with the first transparent conductive film 6 must be provided in order to obtain the preferable electric connectivity, but as long as the required electrical connectivity is provided, there may exist the portion in which the end surface of the first conductive film 5 is not covered with the first transparent conductive film 6.

In addition, in the above description, the wiring structure according to the present invention is applied to the wiring conversion part 45 arranged in the frame region 42 of the TFT array substrate 100, however, the wiring structure may be applied to the region other than the wiring conversion region 45, such as the wiring in the frame region 42 (such as the extended portion of the source wiring 44). Since the region around the wiring in the frame region 42 is also the region where the pattern density of the transparent conductive film is low as compared with the display region 41, the film floating of the second insulating film 9 is likely to occur. However, the occurrence of the film floating of the second insulating film 9 can be suppressed by applying the wiring structure of the present invention to the aforementioned wiring.

In the case where the wiring structure is applied to the source wiring 44 (the extended portion of the source wiring 44) that extends to the frame region 42, the first transparent conductive film 6 is to be formed on the first conductive film 5 serving as the source wiring 44 in such a manner that it covers a side surface of the first conductive film 5, and an angle at a corner part which is in contact with the first insulating film 8 (portion on the outside of the width of the first conductive film 5) is larger than 90 degrees and smaller than 270 degrees. According to the example in FIG. 5, an angle $\theta 16$ formed at a corner part $P_{16}$ at a connection portion of the wiring conversion part 45 and the source wiring 44 (where one side of the source wiring 44 is curved and its width is changed) is set to be larger than 90 degrees and smaller than 270 degrees, so that the film floating of the second insulating film 9 is prevented from occurring at that portion.

With this configuration, an effect similar to the effect obtained in the wiring conversion part 45 can be also obtained in the source wiring 44. That is, the film floating of the second insulating film 9 can be prevented from occurring in the source wiring 44. Furthermore, even in the case where the uppermost layer of the source wiring 44 (first conductive film 5) is formed of a material having a property poor in electrical connectivity with the first transparent conductive film 6, the preferable electrical connectivity can be obtained between the source wiring 44 and the first transparent conductive film 6.

According to the TFT array substrate 100 of the present preferred embodiment, the comb-shaped counter electrode 56 formed of the second transparent conductive film 7 is arranged above the plate-shaped pixel electrode 55 formed of the first transparent conductive film 6. However, in the FFS mode liquid crystal display device, the shapes of the pixel electrode 55 and the counter electrode 56 may be opposite to the aforementioned shapes. That is, the comb-shaped pixel electrode 55 may be formed of the first transparent conductive film 6. However, in this case, since the plate-shaped counter electrode 56 is required to be arranged below the comb-shaped pixel electrode 55, the transparent conductive film of the plate-shaped counter electrode 56 is required to be formed separately from the second transparent conductive film 7.

Second Preferred Embodiment

Figure 14:
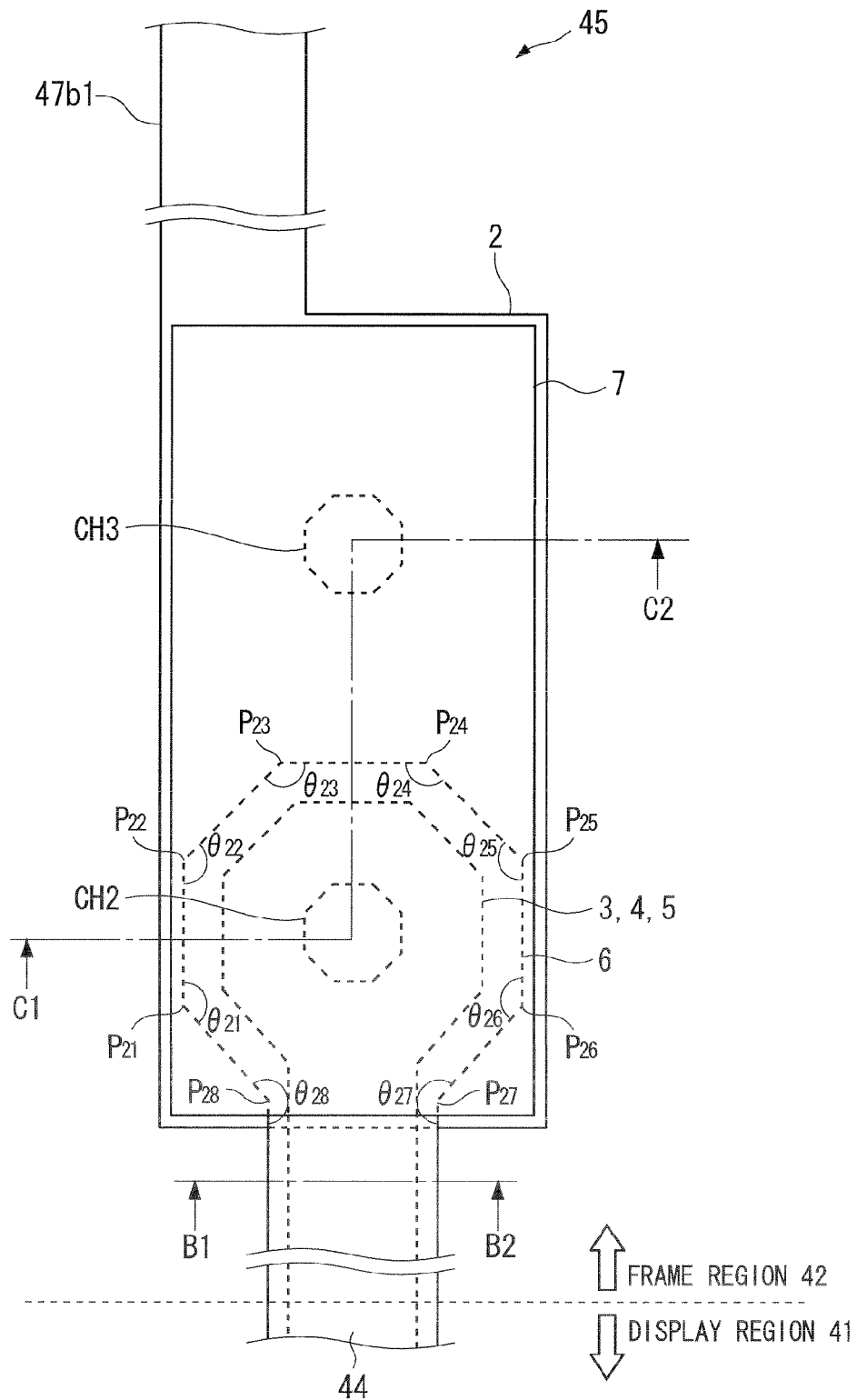
FIG. 14 is a plan view of a wiring conversion part of the TFT array substrate according to the second preferred embodiment.

FIG. 14 is a plan view of the wiring conversion part 45 provided on the TFT array substrate 100 according to a second preferred embodiment. Sectional views taken along line B1-B2 and taken along line C1-C2 in FIG. 14 are the same as those in FIG. 6 and FIG. 7, so that descriptions thereof are omitted here.

Similarly to the first preferred embodiment, in the wiring conversion part 45 in the second preferred embodiment, the first transparent conductive film 6 covers the end surface of the first conductive film 5, and an angle formed at the corner part in the portion of the first transparent conductive film 6 making direct contact with the first insulating film 8 is larger than 90 degrees and smaller than 270 degrees. In the wiring conversion part 45 shown in FIG. 14, the first transparent conductive film 6 has eight corner parts $P_{21}$, $P_{22}$, $P_{23}$, $P_{24}$, $P_{25}$, $P_{26}$, $P_{27}$, and $P_{28}$ in the portion making direct contact with the first insulating film 8, and angles $\theta_{21}$, $\theta_{22}$, $\theta_{23}$, $\theta_{24}$, $\theta_{25}$, $\theta_{26}$, $\theta_{27}$, and $\theta_{28}$ formed at the corner parts are respectively larger than 90 degrees and smaller than 270 degrees.

Furthermore, according to the second preferred embodiment, a shape of the first conductive film 5 and a shape of the first transparent conductive film 6 are similar or substantially similar to each other, and each of the first conductive film 5 and the first transparent conductive film 6 has a line-symmetric or substantially line-symmetric shape. According to the example in FIG. 14, the first conductive film 5 and the first transparent conductive film 6 are similar in shape to each other, and each has a line-symmetric octagon shape.

According to the present preferred embodiment, stress is prevented from concentrating on a specific part of the first transparent conductive film 6 due to the symmetry in shape, so that the film floating of the second insulating film 9 can be further prevented from occurring as compared with the first preferred embodiment. In addition, similarly to the first preferred embodiment, since the end surface of the first conductive film 5 is covered with the first transparent conductive film 6, preferable electrical connectivity can be obtained between the first transparent conductive film 6 and the first conductive film 5.

A method for manufacturing the TFT array substrate 100 of the present preferred embodiment is the same as that of the first preferred embodiment, except for the pattern shapes of the semiconductor film 3, the ohmic contact film 4, the first conductive film 5, and the first transparent conductive film 6 in the wiring conversion part 45. As described in the first preferred embodiment, the patterning of the first conductive film 5 and the patterning of the ohmic contact film 4 and the semiconductor film 3 are sequentially performed in one photolithography step. Accordingly, as shown in FIG. 14, the patterns of the semiconductor film 3 and the ohmic contact film 4 have the same shape as the pattern of the first conductive film 5.

Furthermore, similarly to the first preferred embodiment, in the wiring conversion part 45 in the present preferred embodiment, as long as the preferable electrical connectivity can be ensured between the first transparent conductive film 6 and the first conductive film 5, there may exist the portion in which the end surface of the first conductive film 5 is not covered with the first transparent conductive film 6. In this case, in the wiring conversion part 45, the portion making contact with the first insulating film 8 is relatively reduced in the first transparent conductive film 6, so that the effect of preventing the film floating of the second insulating film 9 can be improved.

Third Preferred Embodiment

FIG. 15 is a plan view of the wiring conversion part 45 provided on the TFT array substrate 100 according to a third preferred embodiment. Sectional views taken along line B1-B2 and taken along line C1-C2 in FIG. 15 are the same as those in FIG. 6 and FIG. 7, respectively, so that descriptions thereof are omitted here.

Similarly to the first preferred embodiment, in the wiring conversion part 45 in the third preferred embodiment, the first transparent conductive film 6 covers the end surface of the first conductive film 5. Furthermore, according to the present preferred embodiment, a corner part in the portion of the first transparent conductive film 6 which makes direct contact with the first insulating film 8 has an arc shape. According to an example in FIG. 15, the first transparent conductive film 6 is rectangular in shape having arc-shaped round corner parts. In the wiring conversion part 45 shown in FIG. 15, the first transparent conductive film 6 has four corner parts $P_{31}$, $P_{32}$, $P_{33}$, and $P_{34}$ in the portion making direct contact with the first insulating film 8, and the corner parts each have an arc shape.

A circle can be understood as a shape in which the number of vertexes of a regular polygon is infinitely increased to an extreme state, or in which an internal angle is infinitely increased to an extreme state. In addition, the circle has a symmetric shape. Therefore, when the shape of the corner part of the first transparent conductive film 6 is the arc shape serving as a part of the circle, stress is further prevented from concentrating on a specific part of the first transparent conductive film 6, so that the film floating of the second insulating film 9 can be further prevented from occurring as compared with the first preferred embodiment.

In addition, similarly to the first preferred embodiment, since the end surface of the first conductive film 5 is covered with the first transparent conductive film 6, preferable electrical connectivity can be obtained between the first transparent conductive film 6 and the first conductive film 5.

In FIG. 15, only the corner part of the first transparent conductive film 6 has the arc shape, but the first transparent conductive film 6 may be entirely formed in the arc shape, that is, the first transparent conductive film 6 may have a circular shape.

A method of manufacturing the TFT array substrate 100 of the present preferred embodiment is similar to that of the first preferred embodiment, except for the pattern shape of the first transparent conductive film 6 in the wiring conversion part 45.

In addition, similarly to the first preferred embodiment, in the wiring conversion part 45 in the present preferred embodiment, as long as the preferable electrical connectivity can be ensured between the first transparent conductive film 6 and the first conductive film 5, there may exist the portion in which the end surface of the first conductive film 5 is not covered with the first transparent conductive film 6. In this case, the portion making contact with the first insulating film 8 is relatively reduced in the first transparent conductive film 6, in the wiring conversion part 45, so that the effect of preventing the film floating of the second insulating film 9 can be improved.

Fourth Preferred Embodiment

Figure 16:
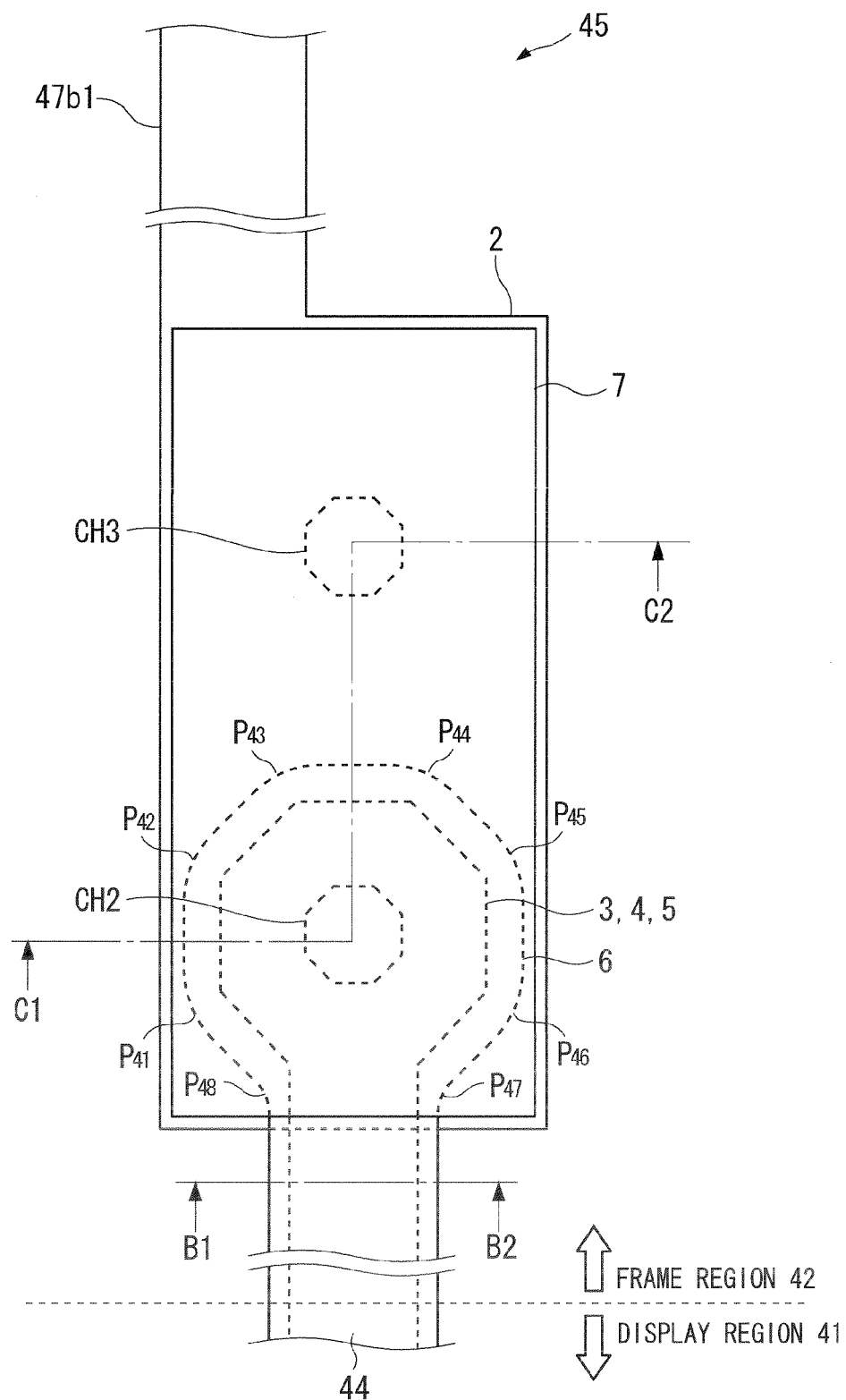
FIG. 16 is a plan view of a wiring conversion part of the TFT array substrate according to the fourth preferred embodiment.

According to a fourth preferred embodiment, the second and third preferred embodiments are combined. FIG. 16 is a plan view of the wiring conversion part 45 on the TRT array substrate 100 according to the fourth preferred embodiment. Sectional views taken along line B1-B2 and taken along line C1-C2 in FIG. 16 are the same as those in FIG. 6 and FIG. 7, respectively, so that descriptions thereof are omitted here.

As shown in FIG. 16, similarly to the first preferred embodiment, the first transparent conductive film 6 covers the end surface of the first conductive film 5, in the wiring conversion part 45 of the fourth preferred embodiment. Furthermore, similarly to the second preferred embodiment, the shape of the first conductive film 5 and the shape of the first transparent conductive film 6 are similar or substantially similar to each other, and each of the first conductive film 5 and the first transparent conductive film 6 $a$ has line-symmetric or substantially line-symmetric shape. Furthermore, similarly to the third preferred embodiment, the corner part in the portion making direct contact with the first insulating film 8 in the first transparent conductive film 6 has the arc shape. According to the example in FIG. 16, the first conductive film 5 and the first transparent conductive film 6 are similar in shape to each other, and have a shape of a line-symmetric octagon. Furthermore, the corner part of the octagon of the first transparent conductive film 6 has the arc shape. In the wiring conversion part 45 shown in FIG. 16, the first transparent conductive film 6 has eight corner parts $P_{41}$, $P_{42}$, $P_{43}$, $P_{44}$, $P_{45}$, $P_{46}$, $P_{47}$, and $P_{48}$, in the portion making direct contact with the first insulating film 8, and each corner part has the arc shape.

According to the present preferred embodiment, due to both effects of the second and third preferred embodiments, stress is further prevented from concentrating on the specific part of the first transparent conductive film 6, so that the film floating of the second insulating film 9 can be prevented from occurring. In addition, similarly to the first preferred embodiment, since the end surface of the first conductive film 5 is covered with the first transparent conductive film 6, there is achieved an effect that preferable electrical connectivity can be obtained between the first transparent conductive film 6 and the first conductive film 5.

A method for manufacturing the TFT array substrate 100 of the present preferred embodiment is the same as that of the second preferred embodiment, except for the pattern shape of the first transparent conductive film 6 in the wiring conversion part 45.

Furthermore, similarly to the first preferred embodiment, in the wiring conversion part 45 in the present preferred embodiment, as long as the preferable electrical connectivity can be ensured between the first transparent conductive film 6 and the first conductive film 5, there may exist the portion in which the end surface of the first conductive film 5 is not covered with the first transparent conductive film 6. In this case, in the wiring conversion part 45, the portion making contact with the first insulating film 8 is relatively reduced in the first transparent conductive film 6, so that the effect of preventing the film floating of the second insulating film 9 can be improved.

Fifth Preferred Embodiment

Figure 17:
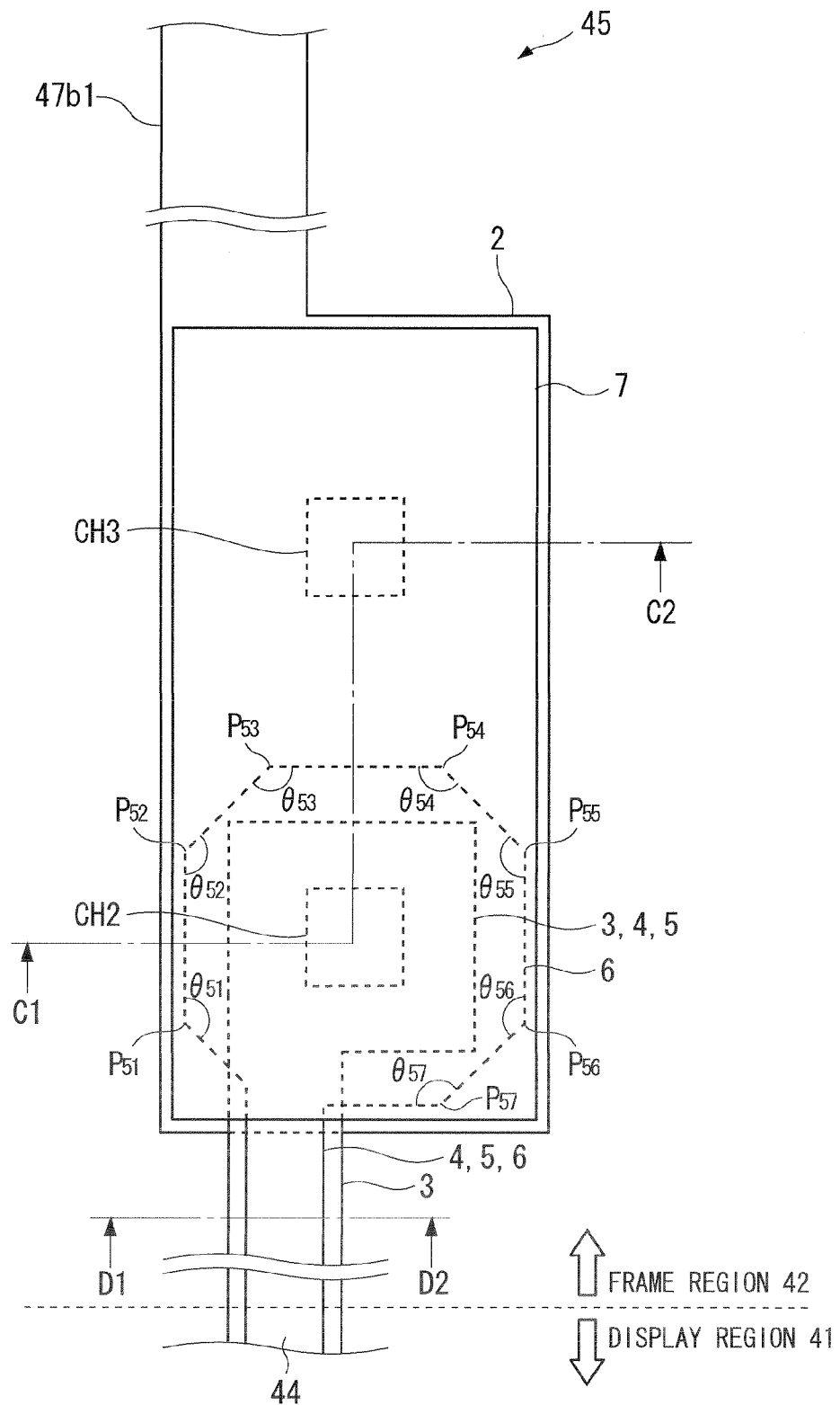
FIG. 17 is a sectional view of a wiring conversion part of the TFT array substrate according to the fifth preferred embodiment.

FIG. 17 is a plan view of the wiring conversion part 45 provided on the TFT array substrate 100 according to a fifth preferred embodiment. FIG. 18 is a sectional view taken along line D1-D2 in FIG. 17. A sectional view taken along line C1-C2 in FIG. 17 is the same as FIG. 7, so that a description thereof is omitted here.

According to the present preferred embodiment, the structure of the wiring conversion part 45 is the same as that of the first preferred embodiment, but a configuration of the source wiring 44 which is drawn into the wiring conversion part 45 is different from that of the first preferred embodiment. That is, in the wiring conversion part 45, the first transparent conductive film 6 covers the end surface of the first conductive film 5, and an angle formed at a corner part in a portion making direct contact with the first insulating film 8 in the first transparent conductive film 6 is larger than 90 degrees and smaller than 270 degrees. In the wiring conversion part 45 shown in FIG. 17, the first transparent conductive film 6 has seven corner parts $P_{51}$, $P_{52}$, $P_{53}$, $P_{54}$, $P_{55}$, $P_{56}$, and $P_{57}$ in the portion making direct contact with the first insulating film 8, and angles $\theta_{51}$, $\theta_{52}$, $\theta_{53}$, $\theta_{54}$, $\theta_{55}$, $\theta_{56}$, and $\theta_{57}$ formed at the corner parts are respectively larger than 90 degrees and smaller than 270 degrees.

Meanwhile, as for the source wiring 44, as shown in FIG. 18, a position of the end of the first transparent conductive film 6 is the same as those of the ends of the ohmic contact film 4 and the first conductive film 5. That is, unlike the first preferred embodiment (FIG. 6), the first transparent conductive film 6 on the source wiring 44 does not cover the end surface of the first conductive film 5, and does not make contact with the first insulating film 8.

As described in the first preferred embodiment (FIG. 7), in the wiring conversion part 45, the lower conductive film 2 and the first conductive film 5 are electrically connected to each other through the contact hole CH3, the second transparent conductive film 7, the contact hole CH2, and the first transparent conductive film 6. The end surface of the first conductive film 5 is covered with the first transparent conductive film 6, so that even when the electrical connectivity is poor between the uppermost layer of the first conductive film 5 and the first transparent conductive film 6, the preferable electrical connectivity can be ensured between the first conductive film 5 and the first transparent conductive film 6. As a result, the preferable electrical connectivity can be obtained even between the lower conductive film 2 and the first conductive film 5. In order to obtain this effect, the end surface of the first conductive film 5 is covered with the first transparent conductive film 6 in the region close to the contact hole CH2.

Meanwhile, in the source wiring 44, although the first transparent conductive film 6 on the first conductive film 5 functions as the redundant wiring of the source wiring 44, its electrical resistance is higher than electrical resistance of the first conductive film 5. Thus, even when the end surface of the first conductive film 5 is covered with the first transparent conductive film 6 as in the first preferred embodiment (FIG. 6), it hardly contributes to ensuring of the preferable electrical connectivity between the lower conductive film 2 and the first conductive film 5. Therefore, even when the first transparent conductive film 6 does not cover the first conductive film 5 in the source wiring 44 as in the present preferred embodiment, the above effect can be obtained similarly to the first preferred embodiment.

That is, in order to ensure the preferable electrical connectivity between the lower conductive film 2 and the first conductive film 5, the first transparent conductive film 6 only has to cover at least the end surface of the first conductive film 5 in the region close to the contact hole CH2 in the wiring conversion part 45, and the first transparent conductive film 6 may not always cover the end surface of the first conductive film 5, in the source wiring 44 in the region apart from the contact hole CH2.

In addition, as in the present preferred embodiment, according to the configuration in which the first transparent conductive film 6 does not cover the end surface of the first conductive film 5 and does not make contact with the first insulating film 8 in the source wiring 44, stress can be prevented from occurring in the first transparent conductive film 6 on the source wiring 44, and the film floating of the second insulating film 9 can be prevented from occurring on the source wiring 44. Especially, this is effective for the source wiring 44 (extended portion) led out to the frame region 42 having the relatively low pattern density of the transparent conductive film.

Furthermore, a method of manufacturing the TFT array substrate 100 in the present preferred embodiment is the same as that of the first preferred embodiment, except for the pattern shapes of the ohmic contact film 4, the first conductive film 5, and the first transparent conductive film 6 in the source wiring 44.

As described in the first preferred embodiment, the patterning of the first conductive film 5 and the patterning of the ohmic contact film 4 and the semiconductor film 3 are sequentially performed in one photolithography step. However, the first conductive film 5 and the ohmic contact film 4 are etched away with the resist pattern PR1 used as the mask which is used in patterning the first transparent conductive film 6, in the subsequent step (FIG. 11) of exposing the portion of the semiconductor film 3 serving as the channel region of the TFT 51. In this etching process, the first conductive film 5 and the ohmic contact film 4 positioned on the outside of the width of the first transparent conductive film 6 are removed, but the semiconductor film 3 is not removed. Therefore, in the source wiring 44 in the present preferred embodiment, as shown in FIG. 17 and FIG. 18, the widths of the first conductive film 5 and the ohmic contact film 4 are substantially the same as the width of the first transparent conductive film 6, and equal to or smaller than the width of the semiconductor film 3.

Furthermore, similarly to the first preferred embodiment, in the wiring conversion part 45 in the present preferred embodiment, as long as the preferable electrical connectivity can be ensured between the first transparent conductive film 6 and the first conductive film 5, there may exist the portion in which the end surface of the first conductive film 5 is not covered with the first transparent conductive film 6. In this case, in the wiring conversion part 45, the portion making contact with the first insulating film 8 is relatively reduced in the first transparent conductive film 6, so that the effect of preventing the film floating of the second insulating film 9 can be improved.

In addition, the configuration of the wiring conversion part 45 is similar to that of the first preferred embodiment herein, but the present preferred embodiment can be applied to any of the second to fourth preferred embodiment.

Sixth Preferred Embodiment

Figure 21:
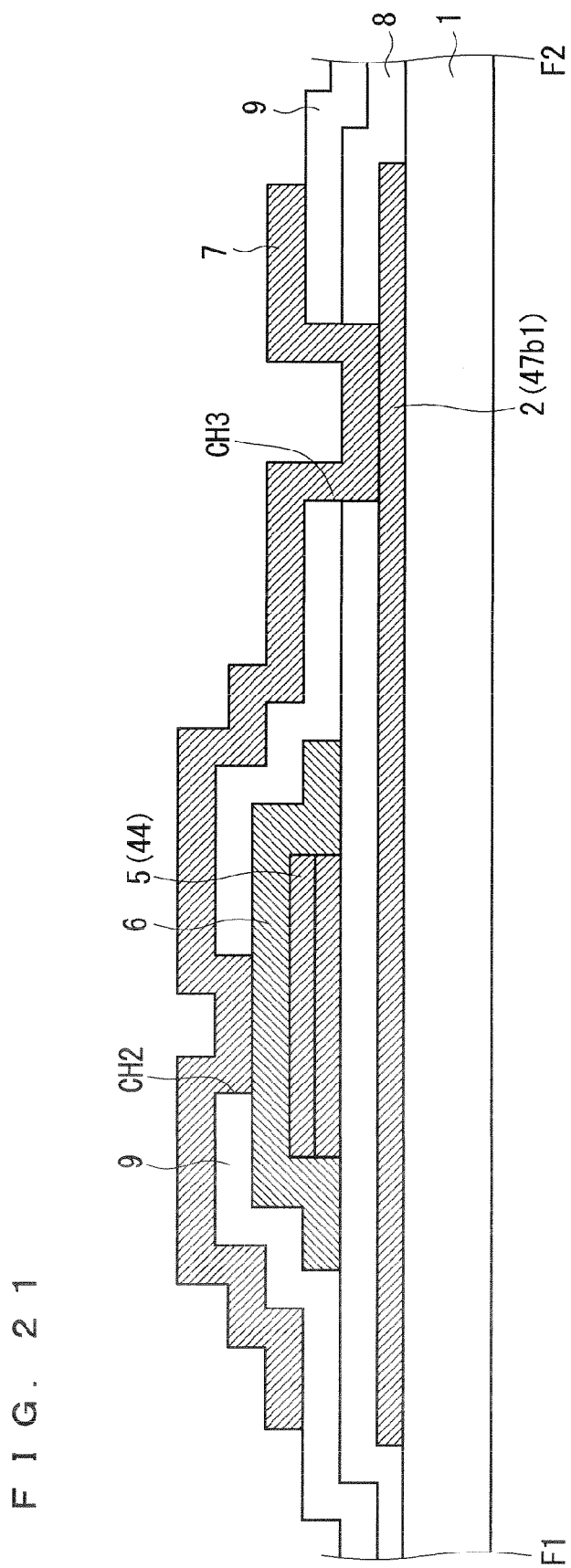
FIG. 21 is a sectional view of the wiring conversion part of the TFT array substrate according to the sixth preferred embodiment.

FIG. 19 to FIG. 21 are views showing a configuration of the wiring conversion part 45 on the TFT array substrate 100 according to a sixth preferred embodiment. FIG. 19 is a plan view of the wiring conversion part 45, FIG. 20 is a sectional view taken along line E1-E2 in FIG. 19, and FIG. 21 is a sectional view taken along line F1-F2 in FIG. 19.

As compared with the configuration of the first preferred embodiment (FIG. 5 to FIG. 7), in the wiring conversion part 45 of the sixth preferred embodiment, the ohmic contact film 4 and the semiconductor film 3 are not provided under the first conductive film 5. In the wiring conversion part 45 shown in FIG. 19, similarly to FIG. 5, the first transparent conductive film 6 has six corner parts $P_{61}$, $P_{62}$, $P_{63}$, $P_{64}$, $P_{65}$, and $P_{66}$ in the portion making direct contact with the first insulating film 8 in the first transparent conductive film 6, and angles $\theta_{61}$, $\theta_{62}$, $\theta_{63}$, $\theta_{64}$, $\theta_{65}$, and $\theta_{66}$ formed at the corner parts are respectively larger than 90 degrees and smaller than 270 degrees.

As to the wiring conversion part 45 in the present preferred embodiment, since the ohmic contact film 4 and the semiconductor film 3 are not provided under the first conductive film 5, a level of a step part of the second transparent conductive film 7 which extends over the second insulating film 9 is smaller than that of the first preferred embodiment. Therefore, a probability of disconnection of the first transparent conductive film 6 and the second transparent conductive film 7 at the step part is reduced, and a highly reliable wiring conversion part can be obtained. Additionally, similarly to the first preferred embodiment, there can also be obtained an effect of suppression of occurrence of the film floating, and an effect of obtaining the preferable electrical connectivity between the first transparent conductive film 6 and the second conductive film 5.

A method of manufacturing the TFT array substrate 100 provided with the wiring conversion part 45 according to the sixth preferred embodiment is substantially the same as that of the first preferred embodiment, but it is necessary to separately perform the patterning of the ohmic contact film 4 and the semiconductor film 3, and the patterning of the first conductive film 5, by using different resist patterns, respectively. That is, the patterning of the semiconductor film 3 and the ohmic contact film 4 and the patterning of the first conductive film 5 are sequentially performed in one photolithography step in the first preferred embodiment, but according to the sixth preferred embodiment, it is necessary to separately perform the patterning of the semiconductor film 3 and the ohmic contact film 4, and the patterning of the first semiconductor 5.

Although the configuration of the wiring conversion part 45 is similar to that of the first preferred embodiment herein, the present preferred embodiment can be applied to any of the second to fifth preferred embodiment.

Furthermore, similarly to the first preferred embodiment, in the wiring conversion part 45 in the present preferred embodiment, as long as the preferable electrical connectivity can be ensured between the first transparent conductive film 6 and the first conductive film 5, there may exist the portion in which the end surface of the first conductive film 5 is not covered with the first transparent conductive film 6. In this case, in the wiring conversion part 45, the portion making contact with the first insulating film 8 is relatively reduced in the first transparent conductive film 6, so that the effect of preventing the film floating of the second insulating film 9 can be improved.

In each of the above preferred embodiments, the present invention is applied to the FFS mode TFT array substrate. This is because, since the FFS mode TFT array substrate includes two transparent conductive films, the present invention can be applied to the FFS mode TFT array substrate while suppressing increase in the number of the manufacturing steps.

However, the present invention is widely applicable to thin film electronic devices having transparent conductive films used as the wirings or electrodes. Examples of the thin film electronic devices provided with the TFT array substrate, other than the liquid crystal display device, include a flat display device (flat panel display) such as an organic EL display device, and a photoelectric conversion device such as an image sensor. Also on the wiring or the wiring conversion part provided in the TFT array substrate of these thin film electronic devices, the present invention is applicable to the structure in which the transparent conductive film pattern is provided on the metal pattern, and the insulating film is further provided on the transparent conductive film pattern.

The preferred embodiments of the present invention can be freely combined with each other, or the preferred embodiments of the present invention can be appropriately modified or omitted, within the scope of the present invention.

While the invention has been shown and described in detail, the foregoing description is in all aspects illustrative and not restrictive. It is therefore understood that numerous modifications and variations can be devised without departing from the scope of the invention.

What is claimed is:

1. A wiring structure comprising:
   a first insulating film;
   a first conductive film formed on and over said first insulating film; and
   a first transparent conductive film formed on and over said first conductive film, wherein
   said first transparent conductive film covers at least one part of an end surface of said first conductive film and extends from the end surface toward the first insulating film to make contact with the first insulating film, and
   an angle formed at a corner part of said first transparent conductive film in a region where said first transparent conductive film makes contact with said first insulating film is larger than 90 degrees and smaller than 270 degrees or the corner part has an arc shape.

2. The wiring structure according to claim 1, wherein
   a shape of said first transparent conductive film is substantially similar to a shape of said first conductive film, and
   each of said first transparent conductive film and said first conductive film has a substantially line-symmetric shape.

3. The wiring structure according to claim 1, wherein
   said first conductive film is a laminated film formed by laminating different kinds of conductive films.

4. The wiring structure according to claim 3, wherein
   an uppermost layer of said laminated film is a film made of aluminum or an aluminum alloy.

5. The wiring structure according to claim 4, wherein
   said laminated film includes, other than said uppermost layer, at least one film made of a high melting point metal or a high melting point metal alloy.

6. The wiring structure according to claim 5, wherein said first transparent conductive film includes at least anyone of In$_2$O$_3$, indium tin oxide (ITO), indium zinc oxide (IZO), indium tin zinc oxide (ITZO), and ZnO.

7. The wiring structure according to claim 1, wherein a semiconductor film electrically connected to the first conductive film is provided between said first conductive film and said first insulating film.

8. A wiring structure, comprising:
a first insulating film;
a first conductive film formed on said first insulating film; and
a first transparent conductive film formed on said first conductive film, wherein
said first transparent conductive film covers at least one part of an end surface of said first conductive film, and
an angle formed at a corner part of said first transparent conductive film in a region where said first transparent conductive film makes contact with said first insulating film is larger than 90 degrees and smaller than 270 degrees or the corner part has an arc shape, wherein
a portion of said first conductive film is formed directly above and physically contacting said first insulating film.

9. The wiring structure according to claim 1, further comprising:
a second insulating film formed on said first transparent conductive film;
a second conductive film formed below said second insulating film, and formed in a different layer from a layer of said first conductive film;
a first contact hole formed in said second insulating film and reaching said first transparent conductive film;
a second contact hole formed in said second insulating film and reaching said second conductive film; and
a second transparent conductive film formed on said second insulating film, connected to said first transparent conductive film through said first contact hole, and connected to said second conductive film through said second contact hole.

10. The wiring structure according to claim 9, wherein said first conductive film is a laminated film formed by laminating different kinds of conductive films, and
an uppermost layer of said laminated film is a film made of aluminum or an aluminum alloy.

11. The wiring structure according to claim 10, wherein said laminated film includes, other than said uppermost layer, at least one film made of a high melting point metal or a high melting point metal alloy.

12. The wiring structure according to claim 11, wherein each of said first transparent conductive film and said second transparent conductive film includes at least anyone of In$_2$O$_3$, indium tin oxide (ITO), indium zinc oxide (IZO), indium tin zinc oxide (ITZO), and ZnO.

13. A thin film transistor array substrate comprising:
a wiring structure, said wiring structure comprising:
a first insulating film;
a first conductive film formed on and over said first insulating film; and
a first transparent conductive film formed on and over said first conductive film, wherein
said first transparent conductive film covers at least one part of an end surface of said first conductive film and extends from the end surface toward the first insulating film to make contact with the first insulating film, and
an angle formed at a corner part of said first transparent conductive film in a region where said first transparent conductive film makes contact with said first insulating film is larger than 90 degrees and smaller than 270 degrees or the corner part has an arc shape.

14. The thin film transistor array substrate according to claim 13, further comprising another wiring structure different from said wiring structure, wherein
said other wiring structure includes:
said first conductive film formed on said first insulating film, and
said first transparent conductive film formed on said first conductive film, and
said first transparent conductive film does not cover the end surface of said first conductive film, and does not make contact with said first insulating film.

15. A display device comprising:
a display panel comprising a thin film transistor array substrate, said thin film transistor array substrate comprising a wiring structure, said wiring structure comprising:
a first insulating film;
a first conductive film formed on and over said first insulating film; and
a first transparent conductive film formed on and over said first conductive film, wherein
said first transparent conductive film covers at least one part of an end surface of said first conductive film and extends from the end surface toward the first insulating film to make contact with the first insulating film, and
an angle formed at a corner part of said first transparent conductive film in a region where said first transparent conductive film makes contact with said first insulating film is larger than 90 degrees and smaller than 270 degrees or the corner part has an arc shape.

* * * * *